US010667376B2

United States Patent
Takashima et al.

(10) Patent No.: US 10,667,376 B2
(45) Date of Patent: May 26, 2020

(54) TARGET SUPPLY DEVICE, EXTREME ULTRAVIOLET LIGHT GENERATION DEVICE, AND TARGET SUPPLY METHOD

(71) Applicant: Gigaphoton Inc., Tochigi (JP)

(72) Inventors: Yuta Takashima, Oyama (JP); Yoshifumi Ueno, Oyama (JP)

(73) Assignee: Gigaphoton Inc., Tochigi (JP)

( * ) Notice: Subject to any disclaimer, the term of this patent is extended or adjusted under 35 U.S.C. 154(b) by 0 days.

(21) Appl. No.: 16/593,294

(22) Filed: Oct. 4, 2019

(65) Prior Publication Data
US 2020/0033731 A1    Jan. 30, 2020

Related U.S. Application Data

(63) Continuation of application No. PCT/JP2017/017160, filed on May 1, 2017.

(51) Int. Cl.
*H05G 2/00*    (2006.01)
*G03F 7/20*    (2006.01)

(52) U.S. Cl.
CPC ........... *H05G 2/006* (2013.01); *G03F 7/2012* (2013.01); *G03F 7/2053* (2013.01);
(Continued)

(58) Field of Classification Search
None
See application file for complete search history.

(56) References Cited

U.S. PATENT DOCUMENTS 4,723,262 A * 2/1988 Noda .................. G21B 1/19
378/119
2013/0186976 A1   7/2013 Ishihara et al.
(Continued)

FOREIGN PATENT DOCUMENTS

JP    2006-044000 A    2/2006
JP    2009-106818 A    5/2009
(Continued)

OTHER PUBLICATIONS

International Search Report issued in PCT/JP2017/017160; dated Aug. 1, 2017.
(Continued)

*Primary Examiner* — Michelle M Iacoletti
(74) *Attorney, Agent, or Firm* — Studebaker & Brackett PC

(57) ABSTRACT

A target supply device according to an aspect of the present disclosure includes a vibration element configured to generate a droplet by vibrating a target substance to be output from a nozzle 80, a droplet detection unit configured to detect the droplet, and a control unit 70. A first detection threshold and a second detection threshold to be compared with a detection signal from the droplet detection unit are set to the control unit 70. The first detection threshold is used to generate a light emission trigger for a laser beam. The second detection threshold has a smaller absolute value from a base line of the detection signal than the first detection threshold. The control unit 70 calculates an evaluation parameter for a satellite based on the detection signal and the second detection threshold, and determines a duty value of an electric signal suitable for operation of the vibration element based on the evaluation parameter.

20 Claims, 18 Drawing Sheets

(52) U.S. Cl.
CPC ......... *G03F 7/70033* (2013.01); *H05G 2/005* (2013.01); *H05G 2/008* (2013.01)

(56) References Cited

U.S. PATENT DOCUMENTS

| | | |
|---|---|---|
| 2014/0353528 A1 | 12/2014 | Hayashi et al. |
| 2017/0079126 A1 | 3/2017 | Suzuki et al. |
| 2018/0007771 A1 | 1/2018 | Satou et al. |

FOREIGN PATENT DOCUMENTS

| | | |
|---|---|---|
| JP | 2009-541093 A | 11/2009 |
| JP | 2013-175434 A | 9/2013 |
| JP | 2014-019058 A | 2/2014 |
| JP | 2014-235805 A | 12/2014 |
| JP | 2016-515755 A | 5/2016 |
| WO | 2007/149243 A1 | 12/2007 |
| WO | 2014/161698 A1 | 10/2014 |
| WO | 2016/013515 A1 | 1/2016 |
| WO | 2016/170972 A1 | 10/2016 |

OTHER PUBLICATIONS

International Preliminary Report on Patentability and Written Opinion issued in PCT/JP2017/017160; dated Nov. 5, 2019.

* cited by examiner

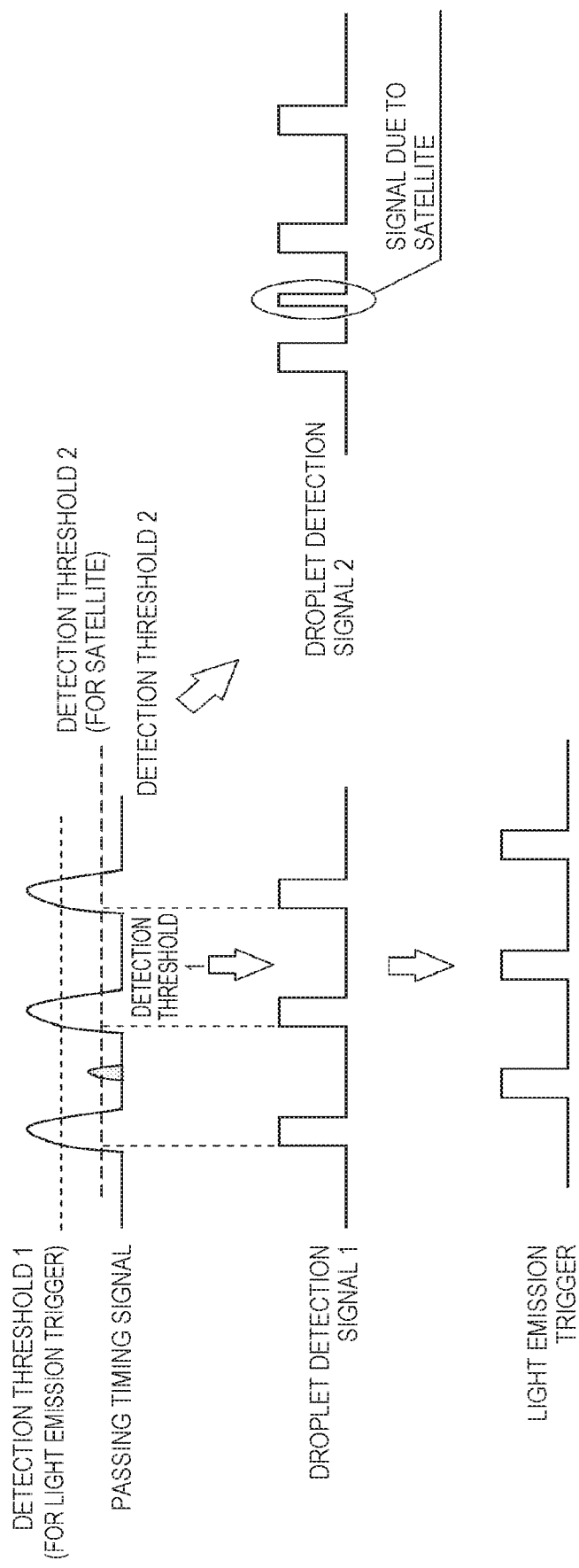

TARGET SUPPLY DEVICE, EXTREME ULTRAVIOLET LIGHT GENERATION DEVICE, AND TARGET SUPPLY METHOD

CROSS-REFERENCE TO RELATED APPLICATIONS

The present application is a continuation application of International Application No. PCT/JP2017/017160 filed on May 1, 2017. The content of the application is incorporated herein by reference in its entirety.

BACKGROUND

1. Technical Field

The present disclosure relates to a target supply device, an extreme ultraviolet light generation device, and a target supply method.

2. Related Art

Recently, miniaturization of a transfer pattern in optical lithography of a semiconductor process has been rapidly proceeding along with miniaturization of the semiconductor process. Minute fabrication at 20 nm or smaller will be requested in the next generation technology. To meet the request for minute fabrication at 20 nm or smaller, for example, it is desired to develop an exposure device including an extreme ultraviolet light generation device configured to generate extreme ultraviolet (EUV) light at a wavelength of 13 nm approximately in combination with reduced projection reflective optics.

Disclosed EUV light generation devices include the three kinds of devices of a laser produced plasma (LPP) device that uses plasma generated by irradiating a target material with a laser beam, a discharge produced plasma (DPP) device that uses plasma generated by electrical discharge, and a synchrotron radiation (SR) device that uses synchrotron radiation.

LIST OF DOCUMENTS

Patent Documents

Patent Document 1: Japanese Unexamined Patent Application Publication No. 2009-106818
Patent Document 2: National Publication of International Patent Application No. 2009-541093

SUMMARY

A target supply device according to an aspect of the present disclosure includes: a tank housing a target substance that is liquid; a nozzle from which the target substance housed in the tank is output; a vibration element driven upon receiving of an electric signal that is a square wave, the vibration element being configured to generate a droplet of the target substance by vibrating the target substance to be output from the nozzle; a droplet detection unit configured to detect the droplet output from the nozzle; and a control unit to which a first detection threshold and a second detection threshold to be compared with a detection signal obtained from the droplet detection unit are set. The first detection threshold is used to generate a light emission trigger for a laser beam with which the droplet is to be irradiated. The second detection threshold has a smaller absolute value from a base line of the detection signal than the first detection threshold. The control unit performs processing of calculating an evaluation parameter for a satellite of the droplet based on the detection signal and the second detection threshold, and processing of determining, based on the evaluation parameter, an operation duty value that is a duty value of the electric signal suitable for operation of the vibration element.

An extreme ultraviolet light generation device according to an aspect of the present disclosure includes: a chamber in which plasma is generated; and a target supply device configured to supply a target as a generation source of the plasma into the chamber. A droplet as the target is supplied from the target supply device into the chamber and irradiated with a laser beam to generate plasma from which extreme ultraviolet light is generated. The target supply device includes: a tank housing a target substance that is liquid; a nozzle from which the target substance housed in the tank is output; a vibration element driven upon receiving of an electric signal that is a square wave, the vibration element being configured to generate a droplet of the target substance by vibrating the target substance to be output from the nozzle; a droplet detection unit configured to detect the droplet output from the nozzle; and a control unit to which a first detection threshold and a second detection threshold to be compared with a detection signal obtained from the droplet detection unit are set. The first detection threshold is used to generate a light emission trigger for a laser beam with which the droplet is to be irradiated. The second detection threshold has a smaller absolute value from a base line of the detection signal than the first detection threshold. The control unit performs processing of calculating an evaluation parameter for a satellite of the droplet based on the detection signal and the second detection threshold, and processing of determining, based on the evaluation parameter, an operation duty value that is a duty value of the electric signal suitable for operation of the vibration element.

A target supply method according to an aspect of the present disclosure uses a target supply device including: a tank housing a target substance that is liquid; a nozzle from which the target substance housed in the tank is output; a vibration element driven upon receiving of an electric signal that is a square wave, the vibration element being configured to generate a droplet of the target substance by vibrating the target substance to be output from the nozzle; and a droplet detection unit configured to detect the droplet output from the nozzle. The target supply method includes: setting a first detection threshold and a second detection threshold to be compared with a detection signal obtained from the droplet detection unit, the second detection threshold having a smaller absolute value from a base line of the detection signal than the first detection threshold; generating a light emission trigger for a laser beam with which the droplet is to be irradiated based on the detection signal and the first detection threshold; calculating an evaluation parameter for a satellite of the droplet based on the detection signal and the second detection threshold; and determining, based on the evaluation parameter, an operation duty value that is a duty value of the electric signal suitable for operation of the vibration element.

BRIEF DESCRIPTION OF THE DRAWINGS

Embodiments of the present disclosure will be described below as examples with reference to the accompanying drawings.

FIG. 22 is an explanatory diagram illustrating an exemplary droplet detection signal generated in the second embodiment.

DESCRIPTION OF EMBODIMENTS

Figure 1:
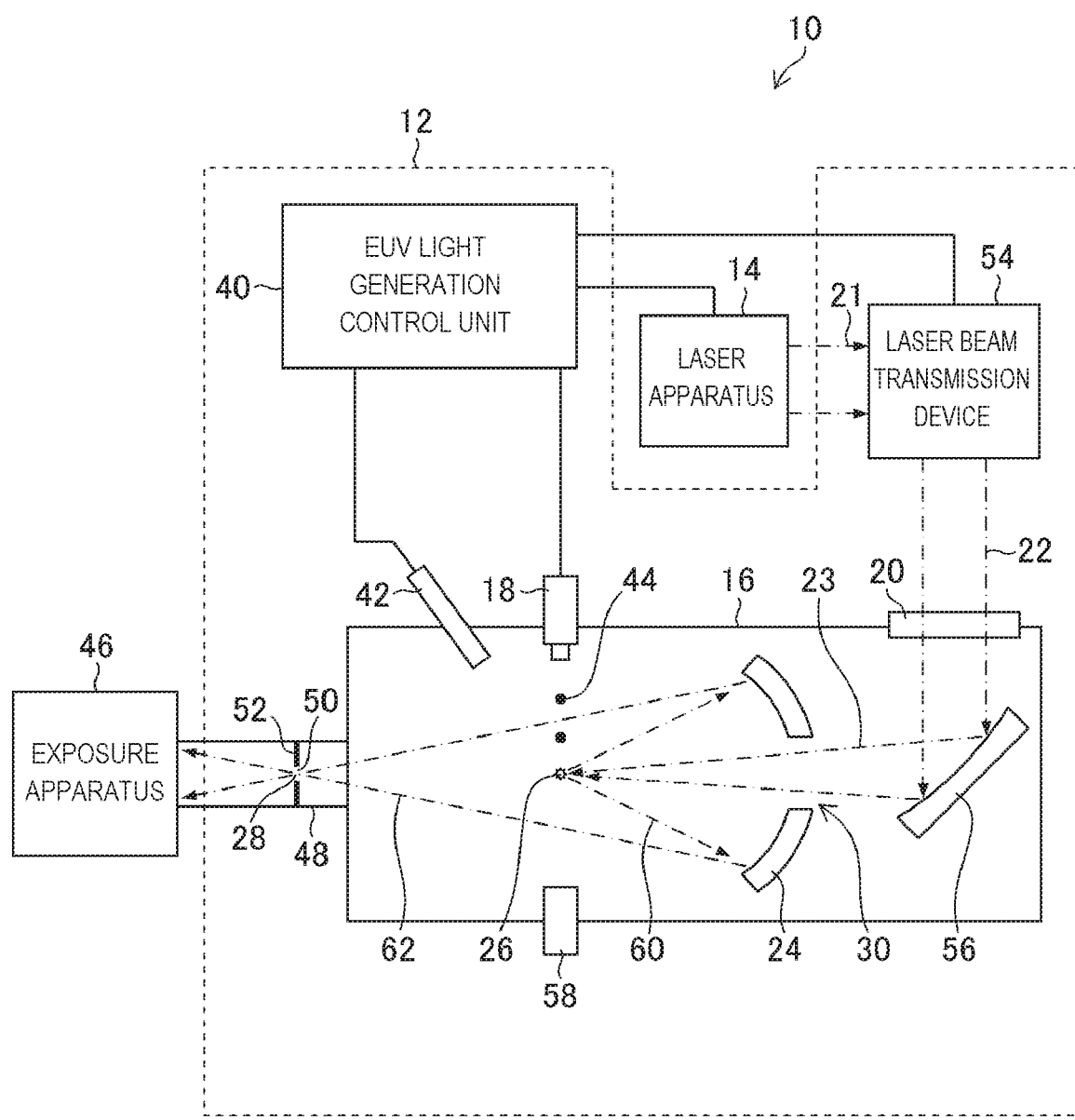
FIG. 1 is a diagram schematically illustrating the configuration of an exemplary LPP EUV light generation system.

<Contents>
1. Overall description of extreme ultraviolet light generation system
1.1 Configuration
1.2 Operation
2. Terms
3. EUV light generation device including target supply device
3.1 Configuration
3.2 Operation
4. Light emission trigger control system of laser apparatus
4.1 Configuration
4.2 Operation
5. Detection threshold applied to droplet detection
6. Droplet connection defect and satellite
7. Problem
7.1 Problem 1
7.2 Problem 2
7.3 Problem 3
8. Embodiment 1
8.1 Configuration
8.2 Operation
8.3 Exemplary piezoelectric duty adjustment processing
8.4 Overview of piezoelectric duty vicinity adjustment
8.5 Overview of piezoelectric duty entire adjustment
8.6 Piezoelectric duty
8.7 Effect
9. Embodiment 2
9.1 Configuration
9.2 Operation
9.3 Effect
10. Modifications of embodiments
10.1 Modification 1
10.2 Modification 2
11. Laser apparatus Embodiments of the present disclosure will be described below in detail with reference to the accompanying drawings. The embodiments described below are examples of the present disclosure, and do not limit the contents of the present disclosure. Not all configurations and operations described in each embodiment are necessarily essential as configurations and operations of the present disclosure. Components identical to each other are denoted by an identical reference sign, and duplicate description thereof will be omitted.

1. Overall Description of Extreme Ultraviolet Light Generation System

1.1 Configuration

FIG. 1 schematically illustrates the configuration of an exemplary LPP EUV light generation system 10. An EUV light generation device 12 is used together with at least one laser apparatus 14 in some cases. In the present application, a system including the EUV light generation device 12 and the laser apparatus 14 is referred to as the EUV light generation system 10. As illustrated in FIG. 1 and described below in detail, the EUV light generation device 12 includes a chamber 16 and a target supply unit 18.

The chamber 16 is a sealable container. The target supply unit 18 supplies a target substance into the chamber 16, and is, for example, attached to penetrate through a wall of the chamber 16. The material of the target substance may contain tin, terbium, gadolinium, lithium, xenon, or a combination of two or more thereof, but is not limited thereto.

The wall of the chamber 16 is provided with at least one through-hole. The through-hole is blocked by a window 20 through which a pulse laser beam 22 output from the laser apparatus 14 transmits. For example, an EUV light focusing mirror 24 having a spheroidal surface is disposed inside the chamber 16. The EUV light focusing mirror 24 has first and second focal points. A multi-layer reflective film in which, for example, molybdenum and silicon are alternately stacked is formed on the surface of the EUV light focusing mirror 24. For example, the EUV light focusing mirror 24 is disposed to have the first focal point positioned in a plasma generating region 26 and the second focal point positioned at an intermediate focusing point (IF) 28. The EUV light focusing mirror 24 is provided with, at a central part, a through-hole 30 through which a pulse laser beam 23 passes.

The EUV light generation device 12 includes an EUV light generation control unit 40, a target sensor 42, and the like. The target sensor 42 detects one or a plurality of the existence, locus, position, and speed of a target 44. The target sensor 42 may have an image capturing function.

The EUV light generation device 12 also includes a connection unit 48 that provides communication between the inside of the chamber 16 and the inside of an exposure apparatus 46. The connection unit 48 includes a wall 52 through which an aperture 50 is formed. The wall 52 is disposed so that the aperture 50 is positioned at the second focal point of the EUV light focusing mirror 24.

In addition, the EUV light generation device 12 includes a laser beam transmission device 54, a laser beam focusing mirror 56, a target collection unit 58 for collecting the target 44, and the like. The laser beam transmission device 54 includes an optical element for defining the transmission state of a laser beam, and an actuator for adjusting the position, posture, and the like of the optical element. The target collection unit 58 is disposed on the extended line of a direction in which the target 44 output into the chamber 16 travels.

The laser apparatus 14 may be a master oscillator power amplifier (MOPA) system. The laser apparatus 14 includes a master oscillator (not illustrated), an optical isolator (not illustrated), and a plurality of $CO_2$ laser amplifiers (not illustrated). The master oscillator may be a solid-state laser. The wavelength of a laser beam output from the master oscillator is, for example, 10.59 μm, and the repetition frequency of pulse oscillation is, for example, 100 kHz.

1.2 Operation

The following describes operation of the exemplary LPP EUV light generation system 10 with reference to FIG. 1. The inside of the chamber 16 is held at a pressure lower than atmospheric pressure, and may be preferably vacuum. Alternatively, gas having a high EUV light transmissivity exists inside the chamber 16.

A pulse laser beam 21 output from the laser apparatus 14 passes through the laser beam transmission device 54 and is incident in the chamber 16 through the window 20 as the pulse laser beam 22. The pulse laser beam 22 travels along at least one laser beam path in the chamber 16 and is reflected by the laser beam focusing mirror 56 and incident on the at least one target 44 as the pulse laser beam 23.

The target supply unit 18 outputs the target 44 made of the target substance toward the plasma generating region 26 in the chamber 16. The target supply unit 18 forms droplets by, for example, a continuous jet scheme. In the continuous jet scheme, a nozzle is vibrated to provide standing wave to flow of the target substance ejected in a jet form from a nozzle hole, thereby periodically separating the target substance. The separated target substance forms a free interface by the own surface tension, thereby forming a droplet.

The target 44 is irradiated with at least one pulse included in the pulse laser beam 23. Plasma is generated from the target 44 irradiated with the pulse laser beam, and radiates radiation light 60. EUV light 62 contained in the radiation light 60 is selectively reflected by the EUV light focusing mirror 24. Having been reflected by the EUV light focusing mirror 24, the EUV light 62 is condensed at the intermediate focusing point 28 and output to the exposure apparatus 46. The single target 44 is irradiated with a plurality of pulses included in the pulse laser beam 23.

The EUV light generation control unit 40 collectively controls the entire EUV light generation system 10. The EUV light generation control unit 40 processes a result of detection by the target sensor 42. The EUV light generation control unit 40 controls, based on the result of detection by the target sensor 42, the timing at which the target 44 is output, the direction in which the target 44 is output, and the like. In addition, the EUV light generation control unit 40 controls the oscillation timing of the laser apparatus 14, the traveling direction of the pulse laser beam 22, the focusing position of the pulse laser beam 23, and the like. These various kinds of control are merely exemplary, and may include other control as necessary.

2. Terms

"Target" is an object irradiated with a laser beam introduced into the chamber. Plasma is generated from the target irradiated with the laser beam and radiates EUV light. The target is the plasma generation source.

"Droplet" is a form of a target supplied into the chamber. The droplet may be the target in the form of droplet having a substantially spherical shape by the surface tension of the target substance being melted. The concept of "droplet" also includes a diffused target obtained by diffusing the target in the form of droplet through irradiation with a pre-pulse laser beam. Droplet is referred to as "DL" in some cases.

"Trajectory of a droplet" is a path on which a droplet travels. The trajectory of a droplet is referred to as a "droplet trajectory" or simply as a "trajectory" in some cases.

"Trajectory direction of a droplet" is a direction parallel to the traveling direction of the droplet. In the trajectory direction of the droplet, "upstream" is defined to be the generation source side of the droplet, and "downstream" is defined to be the destination side of the droplet. The terms "upstream side" and "downstream side" are used to describe a relative positional relation in the trajectory direction of the droplet in some cases.

"Passing timing interval" is the time interval of a passing timing at which a droplet passes through a predetermined position. The passing timing interval corresponds to the passing time interval of the droplet.

"Pulse laser beam" may be a laser beam including a plurality of pulses.

"Laser beam" is not limited to a pulse laser beam but may be a general laser beam.

"Laser beam path" is the optical path of a laser beam.

"$CO_2$" is carbon dioxide.

"Plasma light" is radiation light radiated from plasma of a target. This radiation light includes EUV light.

"EUV light" stands for "extreme ultraviolet light".

"Piezoelectric element" is synonymous with dielectric element. The piezoelectric element is a form of "vibration element". The piezoelectric element is simply referred to as "piezoelectric" or "PZT" in some cases.

"Piezoelectric duty" is the duty of an electric signal for driving a piezoelectric element. The piezoelectric duty is simply referred to as "duty" in some cases.

3. EUV Light Generation Device Including Target Supply Device

3.1 Configuration

Figure 2:
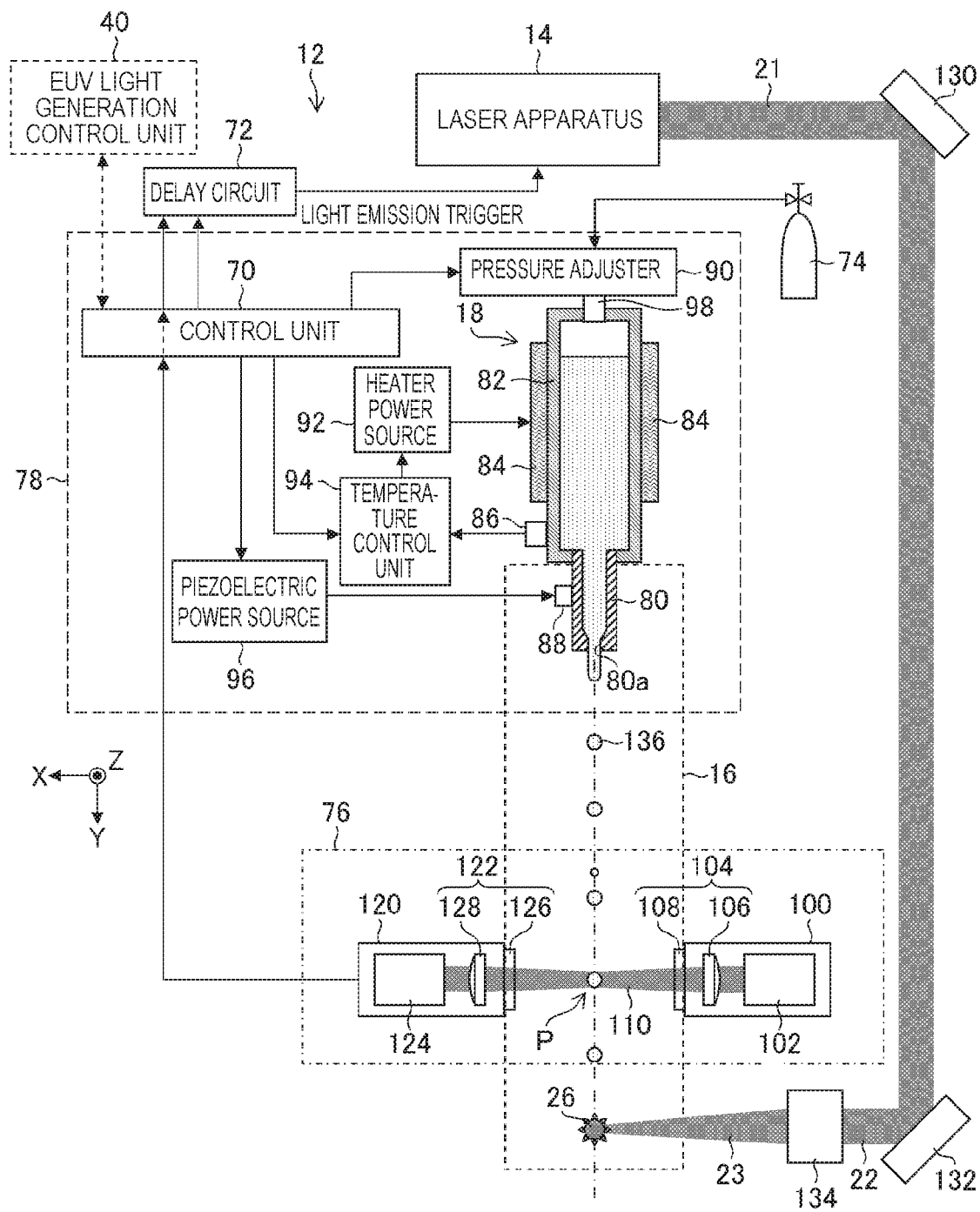
FIG. 2 is a diagram schematically illustrating the configuration of an EUV light generation device including a target supply device.

FIG. 2 schematically illustrates the configuration of an EUV light generation device including a target supply device. This EUV light generation device 12 includes a control unit 70, a delay circuit 72, the target supply unit 18, an inert gas supply unit 74, and a droplet detection device 76.

The target supply unit 18 includes a nozzle 80 from which the target substance is output, a tank 82 in which the target substance is stored, a heater 84, a temperature sensor 86, a piezoelectric element 88, and a pressure adjuster 90.

A target supply device 78 includes the control unit 70, the target supply unit 18, a heater power source 92, a temperature control unit 94, and a piezoelectric power source 96. The target supply device 78 includes the droplet detection device 76.

The tank 82 is formed in a hollow tubular shape. The target substance is housed inside the hollow tank 82. At least the inside of the tank 82 contains a material unlikely to react with the target substance. Examples of materials unlikely to react with tin as an exemplary target substance include SiC, $SiO_2$, $Al_2O_3$, molybdenum, tungsten, and tantalum.

The heater 84 and the temperature sensor 86 are fixed to the tank 82. The heater 84 is fixed to an outer side surface part of the tubular tank 82. The heater 84 fixed to the tank 82 heats the tank 82. The heater 84 is connected with the heater power source 92.

The heater power source 92 supplies electrical power to the heater 84. The heater power source 92 is connected with the temperature control unit 94. The temperature control unit 94 may be connected with the control unit 70 or included in the control unit 70. The electrical power supply from the heater power source 92 to the heater 84 is controlled by the temperature control unit 94.

The temperature sensor 86 is fixed to the outer side surface part of the tank 82. The temperature sensor 86 is connected with the temperature control unit 94. The temperature sensor 86 detects the temperature of the tank 82 and outputs a detection signal to the temperature control unit 94. The temperature control unit 94 can adjust the electrical power supplied to the heater 84 based on the detection signal output from the temperature sensor 86.

A temperature adjustment mechanism including the heater 84 and the heater power source 92 can adjust the temperature of the tank 82 based on a control signal from the temperature control unit 94.

The pressure adjuster 90 is disposed on a pipe 98 between the inert gas supply unit 74 and the tank 82. The pipe 98 can provide communication between the target supply unit 18 including the tank 82 and the pressure adjuster 90. The pipe 98 may be covered by a heat insulation material (not illustrated) or the like. A heater (not illustrated) is disposed on the pipe 98. The temperature in the pipe 98 may be maintained equal to the temperature in the tank 82 of the target supply unit 18.

The inert gas supply unit 74 includes a gas tank filled with inert gas such as helium or argon. The inert gas supply unit 74 supplies the inert gas into the tank 82 through the pressure adjuster 90.

The pressure adjuster 90 may include an electromagnetic valve, a pressure sensor, and the like (not illustrated) for air supply and discharge. The pressure adjuster 90 detects the pressure in the tank 82 by using the pressure sensor (not illustrated). The pressure adjuster 90 is coupled with a discharge pump (not illustrated). The pressure adjuster 90 operates the discharge pump (not illustrated) to discharge gas from the tank 82.

The pressure adjuster 90 increases or decreases the pressure in the tank 82 by supplying gas into the tank 82 or discharging gas from the tank 82. The pressure adjuster 90 is connected with the control unit 70. The pressure adjuster 90 outputs a detection signal of a detected pressure to the control unit 70. The pressure adjuster 90 receives a control signal output from the control unit 70.

The control unit 70 supplies, based on the detection signal output from the pressure adjuster 90, the pressure adjuster 90 with a control signal for controlling operation of the pressure adjuster 90 so that the pressure in the tank 82 becomes equal to a target pressure. The pressure adjuster 90 supplies gas into the tank 82 or discharges gas from the tank 82 based on the control signal from the control unit 70. The pressure in the tank 82 can be adjusted to the target pressure through the gas supply or discharge by the pressure adjuster 90.

The nozzle 80 includes a nozzle hole 80a through which the target substance is output. The target substance output through the nozzle hole 80a may be, for example, liquid tin. The piezoelectric element 88 is fixed to the nozzle 80. The piezoelectric element 88 is connected with the piezoelectric power source 96.

The nozzle 80 is provided at a bottom surface part of the tubular tank 82. The nozzle 80 is disposed inside the chamber 16 through a target supply hole (not illustrated) of the chamber 16. The target supply hole of the chamber 16 is blocked when the target supply unit 18 is disposed. When the target supply unit 18 is disposed to block the target supply hole of the chamber 16, the inside of the chamber 16 is isolated from atmosphere. At least the inner surface of the nozzle 80 contains a material unlikely to react with the target material.

One end of the nozzle 80 in a pipe shape is fixed to the hollow tank 82. The other end of the nozzle 80 in a pipe shape is provided with the nozzle hole 80a. The tank 82 on the one end side of the nozzle 80 is positioned outside the chamber 16, and the nozzle hole 80a on the other end side of the nozzle 80 is positioned inside the chamber 16. The plasma generating region 26 inside the chamber 16 is positioned on the extended line of the center axis of the nozzle 80. The direction of the center axis of the nozzle 80 may be in a Y-axis direction. The insides of the tank 82, the nozzle 80, and the chamber 16 are communicated with each other.

The nozzle hole 80a is formed in such a shape that the target substance being melted is ejected in a jet form into the chamber 16.

The target supply unit 18 forms a droplet 136 by, for example, the continuous jet scheme. In the continuous jet scheme, the nozzle 80 is vibrated to provide standing wave to flow of a target ejected in a jet form, thereby periodically separating the target. The separated target forms a free interface by the own surface tension, thereby forming the droplet 136.

The piezoelectric element 88 and the piezoelectric power source 96 may be elements of a droplet formation mechanism that provides vibration necessary for forming the droplet 136 to the nozzle 80.

The piezoelectric element 88 is fixed to an outer side surface part of the nozzle 80 in a pipe shape. The piezoelectric element 88 fixed to the nozzle 80 provides vibration to the nozzle 80. The piezoelectric element 88 is connected with the piezoelectric power source 96.

The piezoelectric power source 96 supplies electrical power to the piezoelectric element 88. The piezoelectric power source 96 is connected with the control unit 70. The electrical power supply from the piezoelectric power source 96 to the piezoelectric element 88 is controlled by the control unit 70.

The droplet detection device 76 may be part or the entire of the target sensor 42 described with reference to FIG. 1. The droplet detection device 76 detects the droplet 136 output into the chamber 16.

The droplet detection device 76 includes a light source unit 100 and a light receiving unit 120. The light source unit 100 includes a light source 102 and an illumination optical system 104. The light source unit 100 is disposed to illuminate a droplet at a predetermined position P on the trajectory between the nozzle 80 of the target supply unit 18 and the plasma generating region 26. The light source 102 may be a continuous-wave (CW) laser beam source. The illumination optical system 104 includes a condenser lens 106 and a window 108.

The beam diameter of a continuous laser beam with which the droplet 136 is irradiated may be sufficiently larger than the diameter of the droplet 136. The diameter of the droplet 136 is, for example, 20 μm. The condenser lens 106 may be, for example, a cylindrical lens.

The light source unit 100 and the light receiving unit 120 are disposed opposite to each other with interposed therebetween a target travel path that is the travel path of the droplet 136 as a target output into the chamber 16. The direction in which the light source unit 100 and the light receiving unit 120 are opposite to each other is orthogonal to the target travel path.

When the droplet 136 traveling on the target travel path reaches the predetermined position P, the droplet 136 can be irradiated with illumination light 110 emitted from the light source unit 100.

The light receiving unit 120 includes a light receiving optical system 122 and an optical sensor 124. The light receiving unit 120 is disposed to receive the illumination light 110 output from the light source unit 100. The light receiving optical system 122 includes a window 126 and a condenser lens 128. The light receiving optical system 122 may be an optical system such as a collimator, and includes an optical element such as a lens. The light receiving optical system 122 guides, to the optical sensor 124, a continuous laser beam emitted from the light source unit 100.

The optical sensor 124 is a light receiving element including one or a plurality of light-receiving surfaces.

The optical sensor 124 may be any of a photodiode, a photodiode array, an avalanche photodiode, a photomultiplier, a multi pixel photon counter, and an image intensifier. The optical sensor 124 detects the light intensity of the continuous laser beam guided by the light receiving optical system 122. The optical sensor 124 is connected with the control unit 70. The optical sensor 124 supplies a detection signal of the detected light intensity to the control unit 70.

When the droplet 136 passes through the predetermined position P on the target travel path, part of the continuous laser beam is shielded by the droplet 136, and the light intensity received by the light receiving unit 120 decreases. The light receiving unit 120 can output, to the control unit 70, a detection signal in accordance with the light intensity decrease due to the passing of the droplet 136. The detection signal in accordance with the light intensity decrease due to the droplet 136 is referred to as a "passing timing signal".

The control unit 70 can detect the timing at which the droplet 136 is detected at the predetermined position P based on the passing timing signal from the droplet detection device 76. In particular, the control unit 70 can detect the timing at which the droplet 136 passes through the predetermined position P on the target travel path.

The timing at which the droplet detection device 76 detects the droplet 136 is referred to as a "passing timing". The passing timing is the timing at which the droplet 136 passes through the predetermined position P on the target travel path.

The EUV light generation device 12 includes a first high reflectance mirror 130, a second high reflectance mirror 132, and a laser beam focusing optical system 134. The laser beam transmission device 54 described with reference to FIG. 1 includes the first high reflectance mirror 130 and the second high reflectance mirror 132. The laser beam focusing optical system 134 includes the laser beam focusing mirror 56 described with reference to FIG. 1.

Figure 3:
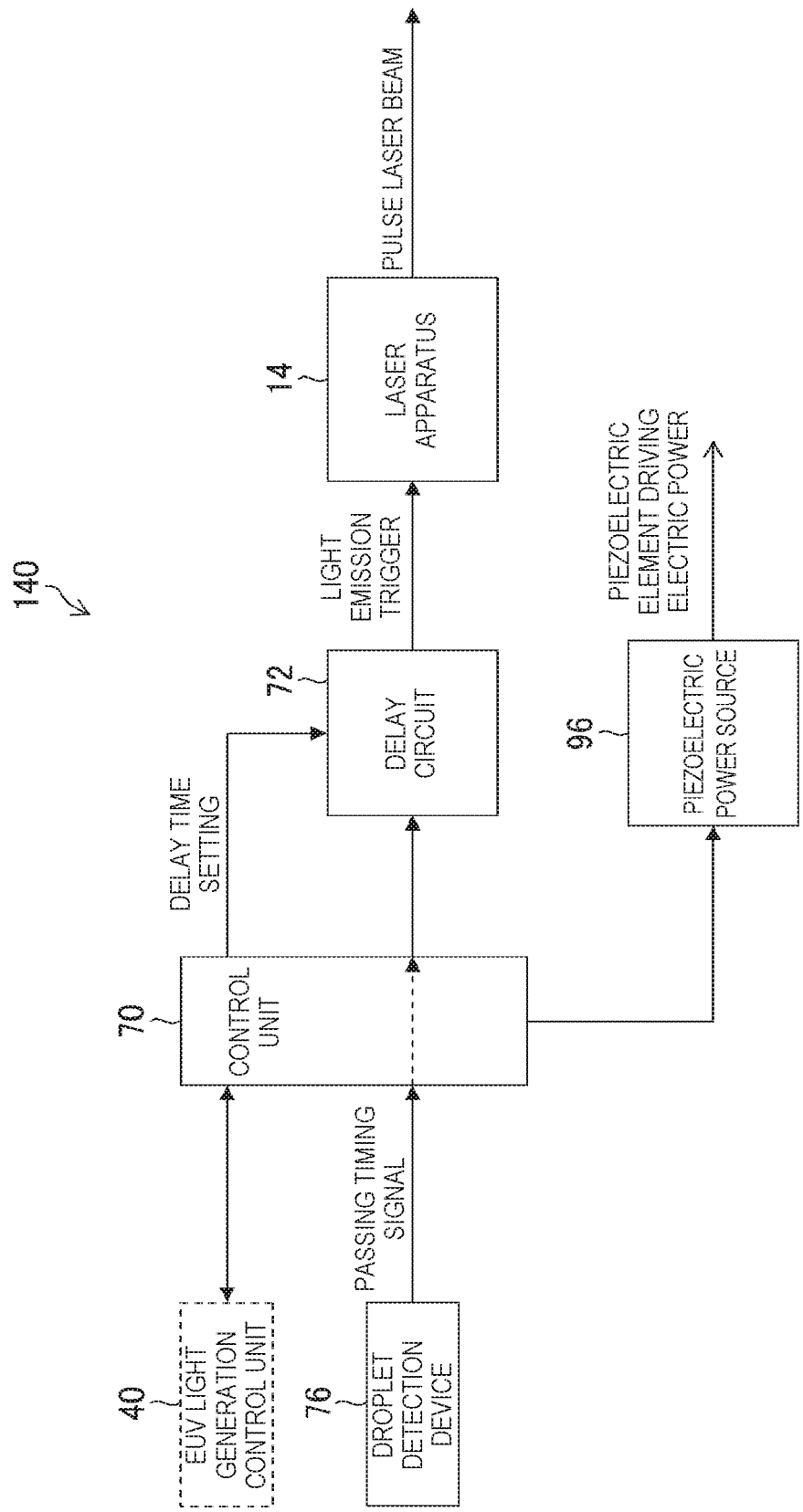
FIG. 3 is a block diagram illustrating the configuration of a control system configured to control a light emission trigger of a laser apparatus.

For the purpose of description related to directions, an XYZ orthogonal coordinate axis is introduced in FIG. 2. The direction of a Z axis is defined to be the direction in which EUV light is guided from the chamber 16 toward the exposure apparatus 46. An X axis and a Y axis are orthogonal to the Z axis and orthogonal to each other. The direction of the Y axis is defined to be the direction of the center axis of the nozzle 80 from which the target substance is output. The direction of the Y axis is the trajectory direction of the droplet 136. The direction of the X axis is defined to be a direction orthogonal to the sheet of FIG. 2. FIG. 3 and the following drawings include the coordinate axes introduced in FIG. 2.

The chamber 16 of the EUV light generation device 12 is formed in, for example, a hollow spherical shape or tubular shape. The direction of the center axis of the chamber 16 in a tubular shape may be the direction in which the EUV light 62 is guided to the exposure apparatus 46, in other words, the Z-axis direction. The chamber 16 includes an exhaust device (not illustrated) and a pressure sensor.

The EUV light generation control unit 40 communicates signals with an exposure apparatus control unit (not illustrated) as a control unit of the exposure apparatus 46. The EUV light generation control unit 40 collectively controls operation of the entire EUV light generation system 10 based on a command from the exposure apparatus 46. The EUV light generation control unit 40 communicates control signals with the laser apparatus 14. Accordingly, the EUV light generation control unit 40 controls operation of the laser apparatus 14.

The EUV light generation control unit 40 communicates control signals with an actuator (not illustrated) of each of the laser beam transmission device 54 and the laser beam focusing optical system 134. Accordingly, the EUV light generation control unit 40 adjusts the traveling direction and focusing position of each of the pulse laser beams 21, 22, and 23.

The EUV light generation control unit 40 communicates control signals with the control unit 70 of the target supply device 78. Accordingly, the EUV light generation control unit 40 controls operation of the target supply device 78, the droplet detection device 76, and the laser apparatus 14.

In the present disclosure, the EUV light generation control unit 40, the control unit 70, and any other control device can be achieved by hardware and software combination of one or a plurality of computers. The software is synonymous with a computer program. The computers conceptually include a programmable controller.

Functions of a plurality of control devices can be achieved by a single control device. In the present disclosure, the EUV light generation control unit 40, the control unit 70, and the other control device may be connected with each other through a communication network such as a local area network or the Internet. In a distributed computing environment, a computer program unit is stored in both of local and remote memory storage devices.

3.2 Operation

The following describes operation of the EUV light generation device 12 with reference to FIG. 2. The EUV light generation control unit 40 controls an exhaust device (not illustrated) so that the inside of the chamber 16 is vacuum. The EUV light generation control unit 40 controls, based on a detected value of a pressure sensor (not illustrated), discharge by the exhaust device and gas supply from a gas supply device (not illustrated) so that the pressure in the chamber 16 is in a predetermined range.

When having received a target generation signal from the EUV light generation control unit 40, the control unit 70 controls the heater 84 through the temperature control unit 94 so that the target substance in the target supply unit 18 has a predetermined temperature equal to or higher than the melting point. The temperature control unit 94 controls the heater power source 92 based on a detected value of the temperature sensor 86 under control of the control unit 70. For example, tin (Sn), which has a melting point of 232° C., is used as the target substance. The control unit 70 controls the heater 84 so that tin in the target supply unit 18 has, for example, a predetermined temperature in the range of 250° C. to 300° C. As a result, the tin stored in the target supply unit 18 melts into liquid. The melted tin corresponds to a form of "liquid target substance".

To discharge the liquid target substance through the nozzle hole 80a, the control unit 70 controls the pressure adjuster 90 so that the pressure in the tank 82 becomes a predetermined pressure. The pressure adjuster 90 can increase or decrease the pressure in the tank 82 by supplying gas into the tank 82 or discharging gas from the tank 82 based on a control signal from the control unit 70. Specifically, the pressure adjuster 90 adjusts, in accordance with an instruction from the control unit 70, the pressure in the tank 82 to a predetermined value so that the droplet 136 reaches the plasma generating region 26 through a predetermined target trajectory at a predetermined target speed.

The predetermined target speed of the droplet 136 may be in, for example, the range of 60 m/s to 110 m/s. The predetermined value of the pressure of the tank 82 may be in, for example, the range of several MPa to 20 MPa. As a result, a jet of the liquid target substance is ejected at the predetermined speed through the nozzle hole 80a.

The control unit 70 transmits an electric signal having a predetermined piezoelectric drive frequency and a predetermined duty to the piezoelectric element 88 through the piezoelectric power source 96 so that the liquid tin output from the nozzle 80 generates the droplet 136.

The piezoelectric power source 96 supplies a drive electrical power to the piezoelectric element 88 in accordance with an instruction from the control unit 70. As a result, the nozzle 80 can be vibrated by the piezoelectric element 88. The droplet 136 can be generated when the jet of the liquid tin is output through the nozzle hole 80a and the nozzle hole 80a is vibrated. Then, the droplet 136 can be supplied to the plasma generating region 26.

As the droplet 136 passes through the predetermined position P on the trajectory between the nozzle hole 80a and the plasma generating region 26, the amount of illumination light incident on the optical sensor 124 of the light receiving unit 120 decreases. The light receiving unit 120 generates a detection signal in accordance with the amount of light received by the optical sensor 124.

The detection signal output from the light receiving unit 120 is transmitted to the control unit 70. The control unit 70 generates a droplet detection signal that becomes a "High" level in a duration in which the amount of light received by the optical sensor 124 is equal to or smaller than a predetermined threshold. The droplet detection signal is input from the control unit 70 to the delay circuit 72.

The delay circuit 72 generates a light emission trigger behind the droplet detection signal by a delay time, and inputs the light emission trigger to the laser apparatus 14. The delay time of the delay circuit 72 is set so that the light emission trigger is input to the laser apparatus 14 before the droplet 136 passes through the predetermined position P and reaches the plasma generating region 26. In other words, the delay time is set so that the droplet 136 is irradiated with a pulse laser beam output from the laser apparatus 14 when the droplet 136 reaches the plasma generating region 26.

The pulse laser beam output from the laser apparatus 14 is guided to the plasma generating region 26 through the first high reflectance mirror 130, the second high reflectance mirror 132, and the laser beam focusing optical system 134, and incident on the droplet 136. The plasma generating region 26 may correspond to the focusing position of the pulse laser beam.

4. Light Emission Trigger Control System of Laser Apparatus

4.1 Configuration

FIG. 3 illustrates the configuration of a light emission trigger control system of the laser apparatus 14. This control system 140 includes the droplet detection device 76, the control unit 70, the delay circuit 72, and the laser apparatus 14.

The delay circuit 72 may be configured as part of the control unit 70. The passing timing signal as an output signal from the droplet detection device 76 is input to the control unit 70. The delay circuit 72 is connected with a line through which the control unit 70 sets the delay time of the delay circuit 72. An output from the delay circuit 72 is input to the laser apparatus 14 as a signal of the light emission trigger.

4.2 Operation

When having received a droplet generation signal from the EUV light generation control unit 40, the control unit 70 transmits, to the delay circuit 72, data for setting a delay time td. The control unit 70 receives the droplet passing timing signal from the droplet detection device 76, generates the droplet detection signal, and inputs the droplet detection signal to the delay circuit 72.

The delay circuit 72 inputs, as the light emission trigger to the laser apparatus 14, a signal delayed behind the droplet detection signal by the delay time td.

Figure 4:
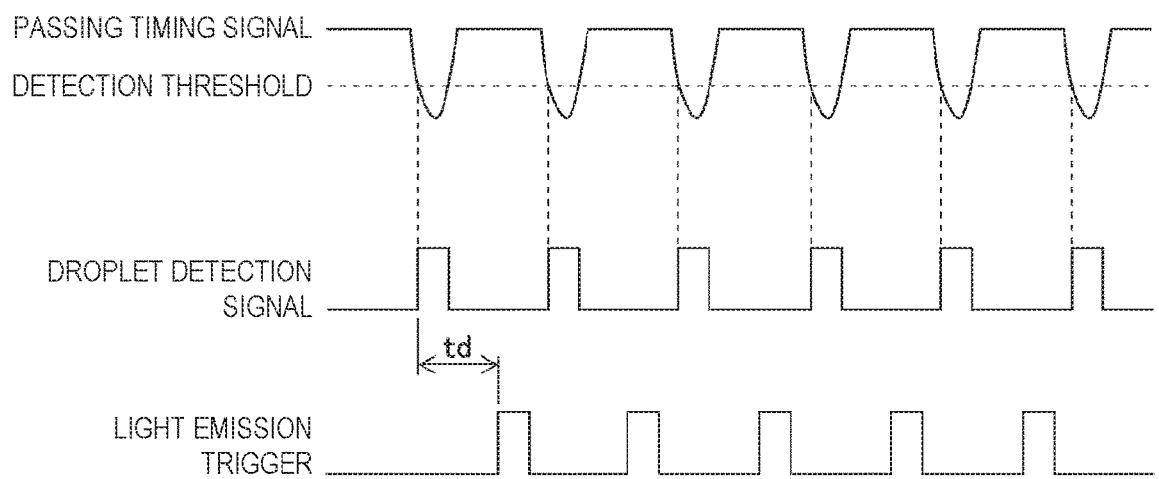
FIG. 4 is a timing chart of a passing timing signal, a droplet detection signal, and a light emission trigger obtained when droplets are normally generated.

FIG. 4 illustrates a timing chart of the passing timing signal, the droplet detection signal, and the light emission trigger obtained when droplets are normally generated.

When the droplet 136 is normally generated, the droplet 136 can pass through the detection range of the droplet detection device 76 at substantially equal intervals. Thus, the passing timing signal has a signal value that changes at a substantially constant period in accordance with passing of each droplet.

The voltage value of the passing timing signal is compared with a light emission trigger detection threshold, and the droplet detection signal is generated in accordance with a result of the comparison. In the present example, the droplet detection signal becomes a "High" level when the passing timing signal is lower than the light emission trigger detection threshold. The droplet detection signal becomes a "Low" level when the passing timing signal exceeds the light emission trigger detection threshold.

The droplet detection signal can be generated by using, for example, a comparator. The passing timing signal is input to a "Vin−" terminal as an input terminal of the comparator. A threshold generator configured to generate a threshold voltage corresponding to the light emission trigger detection threshold is connected with a "Vin+ terminal" as the other input terminal of the comparator. The output of the comparator is at a "High" level while Vin+>Vin− holds. The control unit 70 includes such a comparator, and generates the droplet detection signal from the passing timing signal. The comparator may be included in the droplet detection device 76. The control unit 70 may receive the droplet detection signal output from the droplet detection device 76.

In the present example, the "passing timing" of a droplet is the pulse rise timing of the droplet detection signal. Each time interval between the passing timings of droplets is a substantially identical period Tc. The period Tc may be a natural number multiple of the reciprocal of a predetermined piezoelectric drive frequency $f_p$ at which the piezoelectric element 88 is driven. In other words, the period Tc is substantially equal to $m/f_p$, where m is a natural number. In this example, the natural number m is one.

The time interval of the passing timing is referred to as a "passing timing interval". Thus, the time interval of the droplet detection signal is measured from the interval of the pulse rise timing of the droplet detection signal.

The light emission trigger is generated behind the droplet detection signal by the delay time td in the period Tc substantially equal to that of the droplet detection signal. The laser apparatus 14 outputs a laser beam at a substantially constant time interval when the light emission trigger is supplied to the laser apparatus 14. Thus, the temperature of the excitation medium of the laser apparatus 14 is asymptotically substantially constant, and the pulse energy of an output laser beam is stabilized accordingly.

5. Detection Threshold Applied to Droplet Detection

Figure 5:
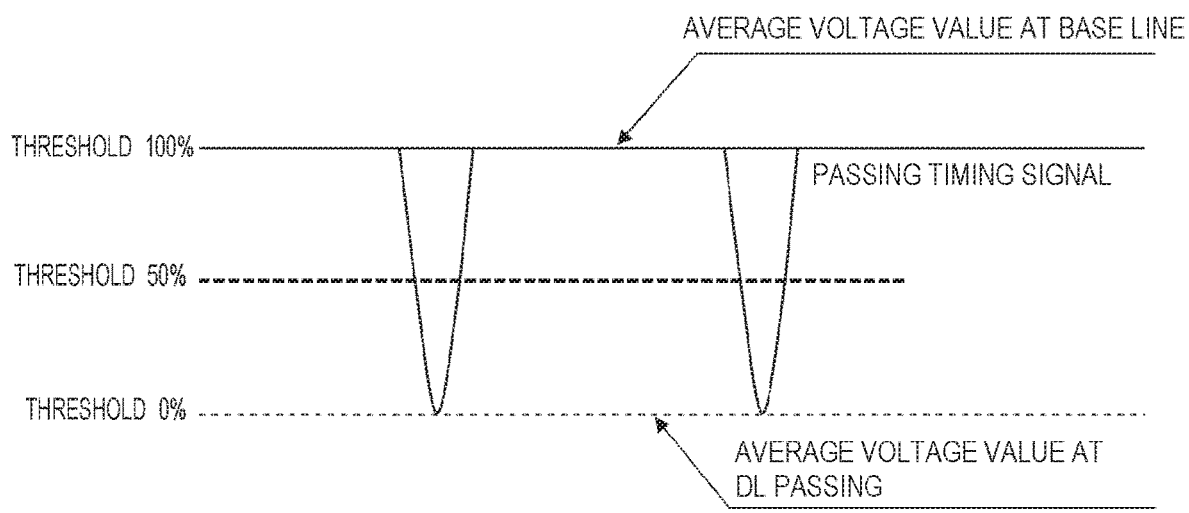
FIG. 5 is a diagram illustrating an exemplary relation between the waveform of the passing timing signal and a detection threshold.

FIG. 5 illustrates an exemplary relation between the waveform of a passing timing signal obtained from the droplet detection device and a detection threshold. The detection threshold is simply referred to as a "threshold" in some cases. In FIG. 5, the horizontal axis represents time, and the vertical axis represents voltage. In the example illustrated in FIG. 5, the threshold is set to be 0 to 100% with the lower limit of 0% taken to be an average voltage value at droplet passing and the upper limit of 100% taken to be an average voltage value at the base line. The base line corresponds to a signal from the light receiving unit 120 when there is no detected target droplet.

In a configuration in which the optical sensor 124 is a photodiode array (PDA), the upper and lower limits of the threshold are set for each channel of the optical sensor 124. In setting of the threshold, such an expression that "the threshold is high" or "the threshold is increased" indicates that the threshold is on a side closer to 100%. Such an expression that "the threshold is low" or "the threshold is decreased" indicates that the threshold is on a side closer to 0%.

6. Droplet Connection Defect and Satellite

Tin droplets are continuously discharged from the nozzle 80 when a square wave drive signal at the piezoelectric drive frequency $f_p$ is applied from the piezoelectric power source 96 to the piezoelectric element 88. Some of the droplets discharged from the nozzle 80 are connected with each other while falling and then detected by the droplet detection device 76. A droplet in which a plurality of droplets are connected to have a certain mass is referred to as a main DL in some cases.

Figure 6:
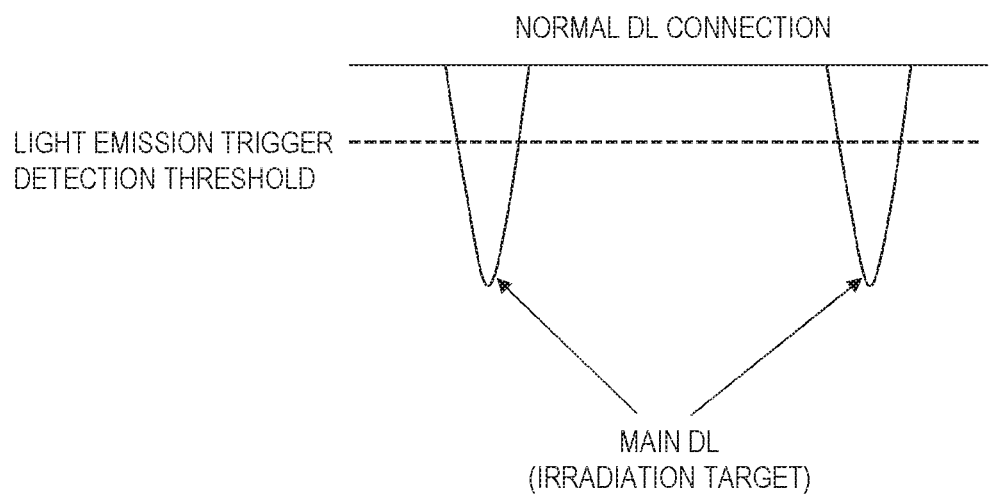
FIG. 6 is a waveform diagram illustrating an exemplary passing timing signal obtained when connection between droplets is normal.

FIG. 6 illustrates an exemplary passing timing signal obtained when connection between droplets is normal. At normal DL connection, the passing timing signal obtained when a droplet passes through the predetermined position P reaches the light emission trigger detection threshold, and the main DL is detected. The detected main DL is to be irradiated with a laser beam.

For some reason, the target supply unit 18 sometimes generates a droplet having a connection defect or a satellite due to anomalous droplet connection. In the present disclosure, "DL connection defect" and "satellite" are distinguished from each other as follows.

Figure 7:
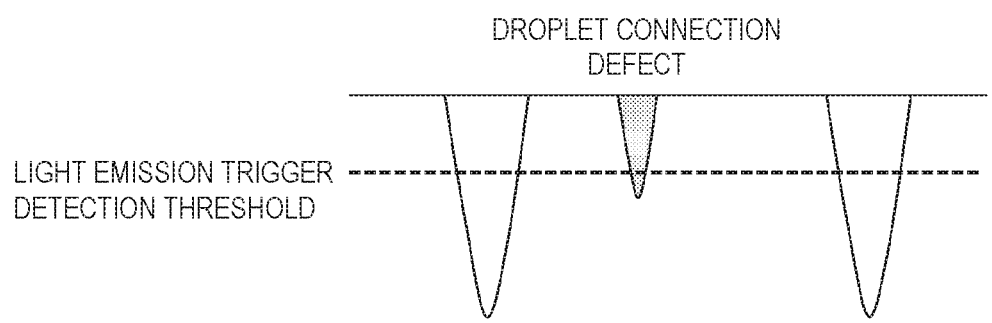
FIG. 7 is a waveform diagram illustrating an exemplary passing timing signal obtained when a droplet connection defect occurs.

FIG. 7 illustrates an exemplary passing timing signal obtained when a DL connection defect occurs. The DL connection defect indicates a state in which there is an excess DL detected based on the light emission trigger detection threshold as illustrated in FIG. 7. The DL connection defect has relatively large influence on EUV performance and causes Sn contamination in the chamber.

Figure 8:
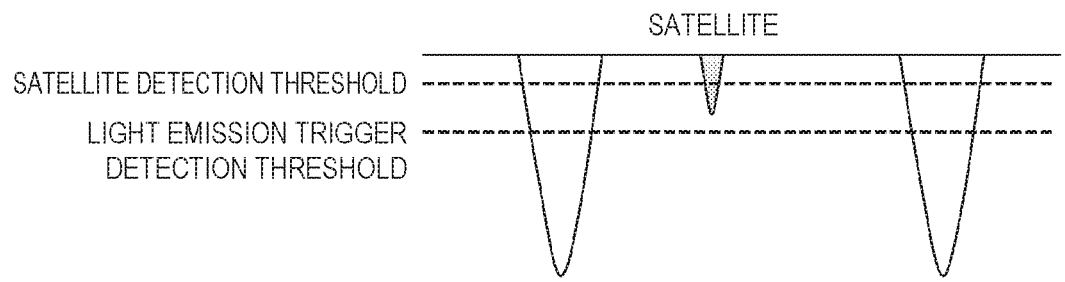
FIG. 8 is a waveform diagram illustrating an exemplary passing timing signal obtained when a satellite occurs.

FIG. 8 illustrates an exemplary passing timing signal obtained when a satellite occurs. The satellite indicates a state in which there is an excess DL not detected based on the light emission trigger detection threshold but detected based on a detection threshold higher than the light emission trigger detection threshold. The satellite has relatively small influence on EUV performance but causes Sn contamination in the chamber.

7. Problem

7.1 Problem 1

Conventionally, the light emission trigger detection threshold has been only one detection threshold set for the passing timing signal. Thus, it has been impossible to detect a satellite causing a small signal change that does not reach the light emission trigger detection threshold.

Figure 9:
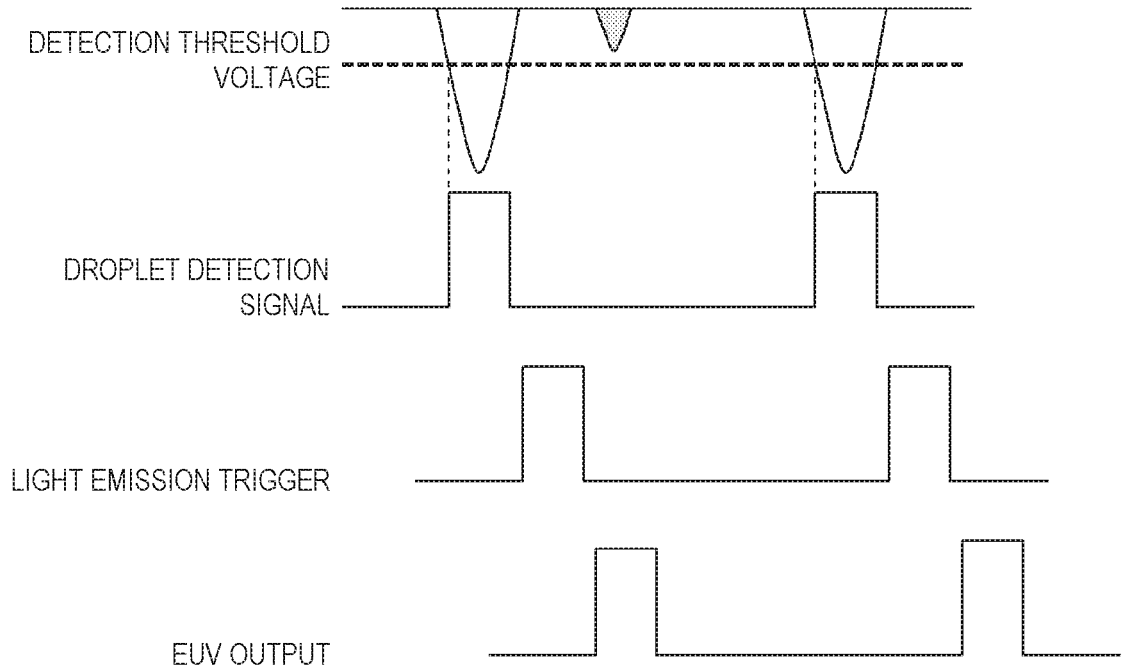
FIG. 9 is a timing chart illustrating an exemplary light emission trigger and an exemplary EUV output generated when a satellite occurs.

FIG. 9 is a timing chart illustrating an exemplary light emission trigger and an exemplary EUV output generated when a satellite occurs. When laser beam irradiation is performed while the satellite is not detected, the satellite is not irradiated with a laser beam but scatters while not being ionized. Thus, particles of the satellite cannot be subjected to magnetic field mitigation, and thus can cause contamination inside the chamber.

The magnetic field mitigation reduces contamination of an optical element in the chamber due to debris such as electrically charged particles by capturing the electrically charged particles by using a magnetic field. The chamber 16 includes a magnet (not illustrated) for generating a magnetic field in the chamber 16. The target collection unit 58 is disposed where magnetic force lines converge. Electrically charged particles moving in the chamber 16 are trapped by the magnetic force lines and collected to the target collection unit 58. However, unionized satellite particles are not trapped by the magnetic force lines and can cause contamination.

7.2 Problem 2

Figure 10:
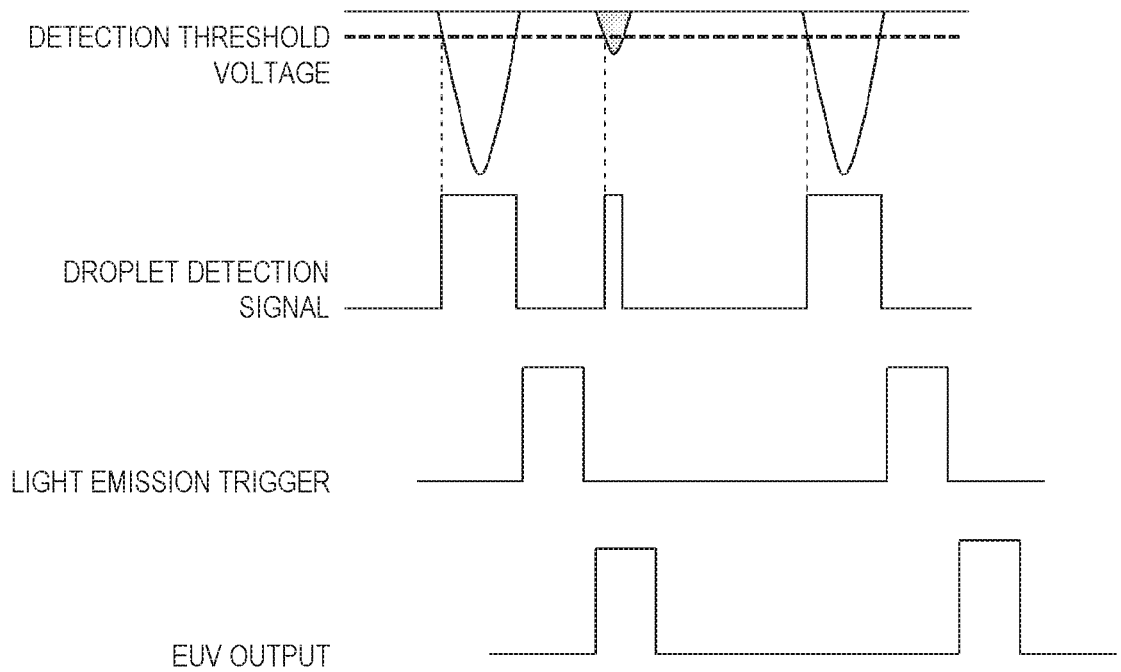
FIG. 10 is a timing chart illustrating an exemplary light emission trigger and an exemplary EUV output generated when a light emission trigger detection threshold is set to be high.

When the light emission trigger detection threshold is set to be high, the light emission trigger is generated for a satellite not detected in FIG. 9. FIG. 10 is a timing chart illustrating an exemplary light emission trigger and an exemplary EUV output generated when the light emission trigger detection threshold is set to be high unlike FIG. 9. As illustrated in FIG. 10, when the light emission trigger detection threshold is set to be high, the light emission trigger is generated in accordance with a pulse of the droplet detection signal upon detection of a satellite. Thus, the light emission trigger is generated at an interval shorter than a laser frequency requested for normal operation, which potentially causes failure of the laser apparatus.

7.3 Problem 3

Figure 11:
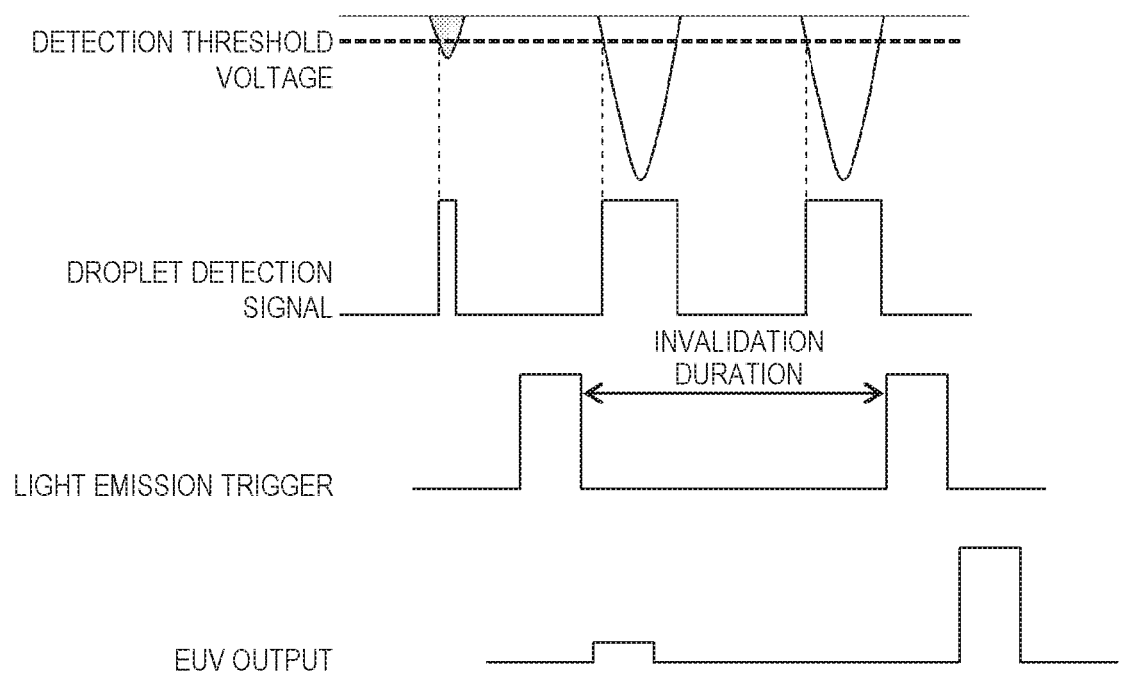
FIG. 11 is a timing chart illustrating another exemplary light emission trigger and another exemplary EUV output generated when the light emission trigger detection threshold is set to be high.

Alternatively, when the light emission trigger detection threshold is set to be high, the light emission trigger generated at an interval shorter than the requested laser frequency is invalidated by some method. Since a satellite has a mass smaller than that of a normal droplet, the amount of excitation light from tin is smaller. Thus, when the satellite is irradiated with a laser beam, the EUV output largely decreases as compared to a case in which a normal droplet is irradiated with a laser beam. For example, when a satellite is detected first as illustrated in FIG. 11, a normal droplet exists in a duration in which the light emission trigger is invalidated. In this case, the normal droplet is not irradiated with a laser beam, but the satellite is wrongly irradiated with a laser beam. Accordingly, the EUV output largely decreases.

In addition, when a satellite occurs, the mass of a main droplet decreases by that of the satellite, and thus the EUV output decreases. An EUV output indicated by the first pulse in an EUV output waveform illustrated in FIGS. 10 and 11 is lower than an EUV output obtained when a droplet having normal DL connection is irradiated with a laser beam.

8. Embodiment 1

8.1 Configuration

Figure 12:
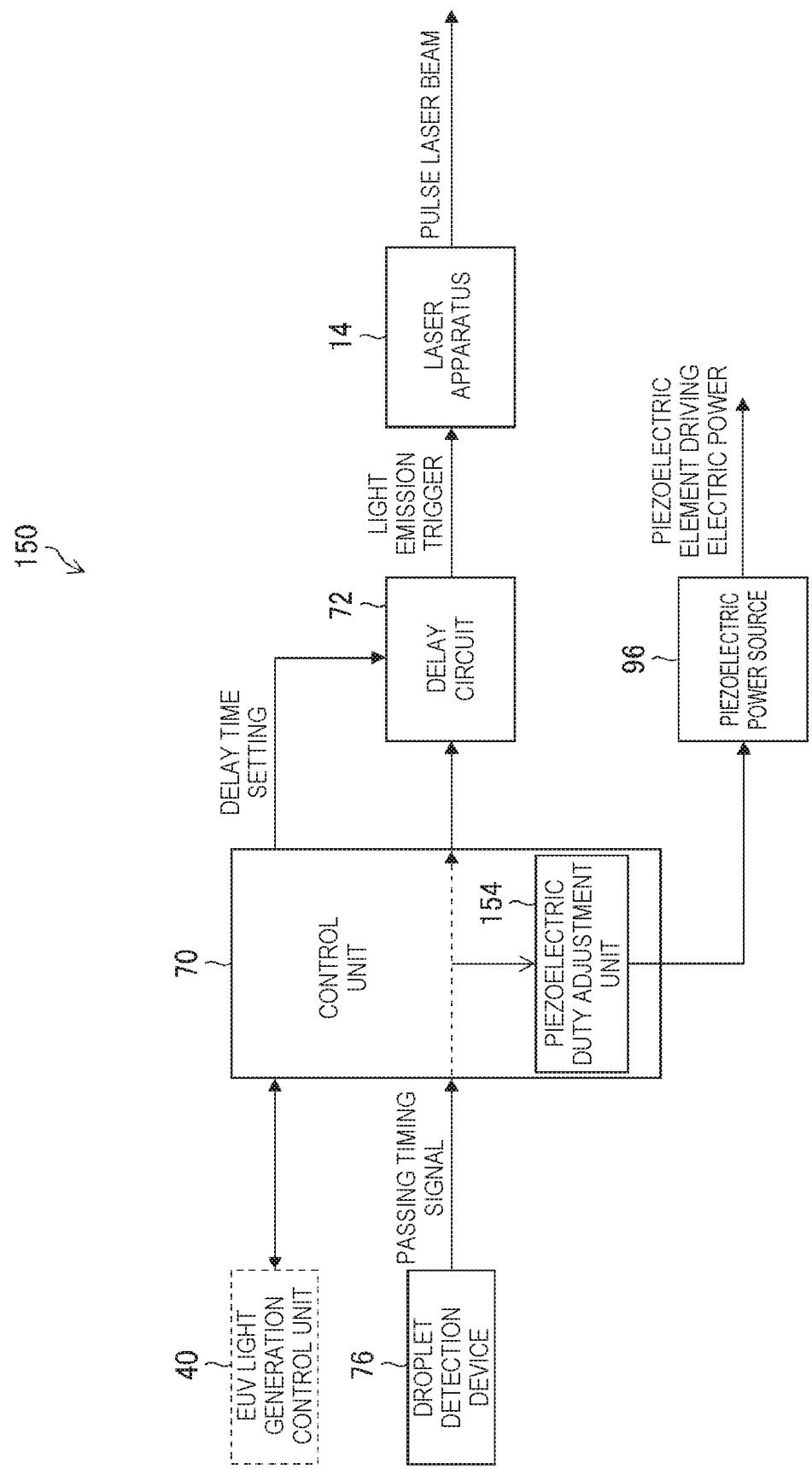
FIG. 12 is a block diagram illustrating the configuration of a control system in a target supply device according to a first embodiment.

FIG. 12 is a block diagram illustrating the configuration of a control system in a target supply device according to a first embodiment. The target supply device according to the first embodiment may include a control system 150 illustrated in FIG. 12 in place of the control system 140 described with reference to FIG. 3.

The control unit 70 includes a piezoelectric duty adjustment unit 154. The control unit 70 includes a memory unit (not illustrated) for storing various kinds of data necessary for control and calculation processing.

The piezoelectric duty adjustment unit 154 may be a circuit configured to output a signal to the piezoelectric power source 96 based on a duty value specified by the control unit 70. Alternatively, the piezoelectric duty adjustment unit 154 may be an external device such as a function generator capable of supplying a signal waveform to the piezoelectric power source 96 based on a duty value specified by the control unit 70.

Figure 13:
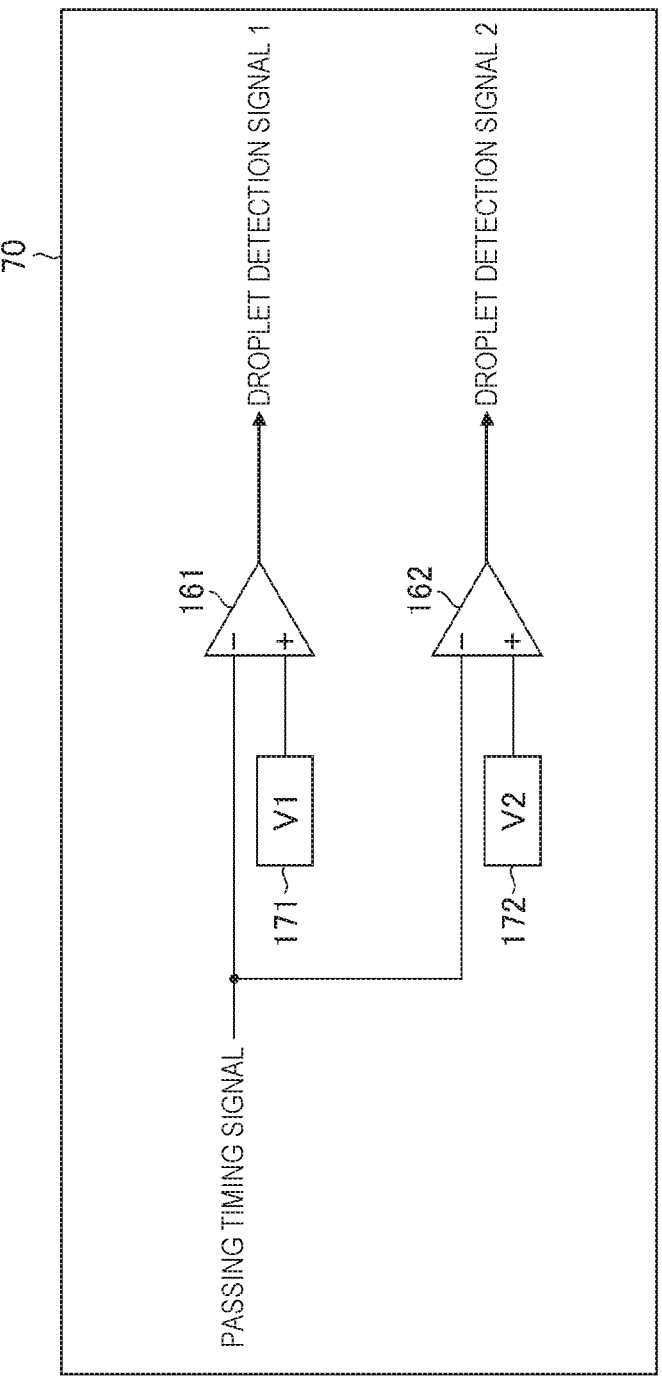
FIG. 13 is a diagram illustrating an exemplary partial circuit configuration included in a control unit.

FIG. 13 is a diagram illustrating an exemplary partial circuit configuration included in the control unit 70. The control unit 70 includes a first comparator 161, a second comparator 162, a first threshold voltage generator 171, and a second threshold voltage generator 172.

A signal line for the passing timing signal received from the droplet detection device 76 is connected with a Vin− terminal of each of the first comparator 161 and the second comparator 162.

The first threshold voltage generator 171 generates voltage V1 of a voltage value corresponding to a detection threshold 1. The detection threshold 1 is a light emission trigger detection threshold for generating the light emission trigger from the passing timing signal. The first threshold voltage generator 171 is connected with a Vin+ terminal of the first comparator 161.

The second threshold voltage generator 172 generates a voltage V2 of a voltage value corresponding to a detection threshold 2. The detection threshold 2 is a satellite detection threshold for detecting a satellite from the passing timing signal. The second threshold voltage generator 172 is connected with a Vin+ terminal of the second comparator 162. In the present example, the detection threshold 2 is set to be higher than the detection threshold 1. In an example of specific set values of the detection thresholds 1 and 2, the detection threshold 1 may be set to be a value corresponding to 80% when a threshold setting upper limit is taken to be 100%, and the detection threshold 2 may be set to be a value corresponding to 95% of the threshold setting upper limit. In other words, the detection threshold 2 is set to be a value closer to the upper limit than the detection threshold 1 and having a smaller absolute value from the base line than the detection threshold 1. The detection threshold 2 can be used to detect a small passing timing signal that cannot be detected based on the detection threshold 1.

8.2 Operation

The passing timing signal output from the droplet detection device 76 is input to the control unit 70 and input to the Vin− terminal of each of the first comparator 161 and the second comparator 162. A droplet detection signal 1 can be obtained from an output terminal of the first comparator 161. A droplet detection signal 2 can be obtained from an output terminal of the second comparator 162.

Figure 14:
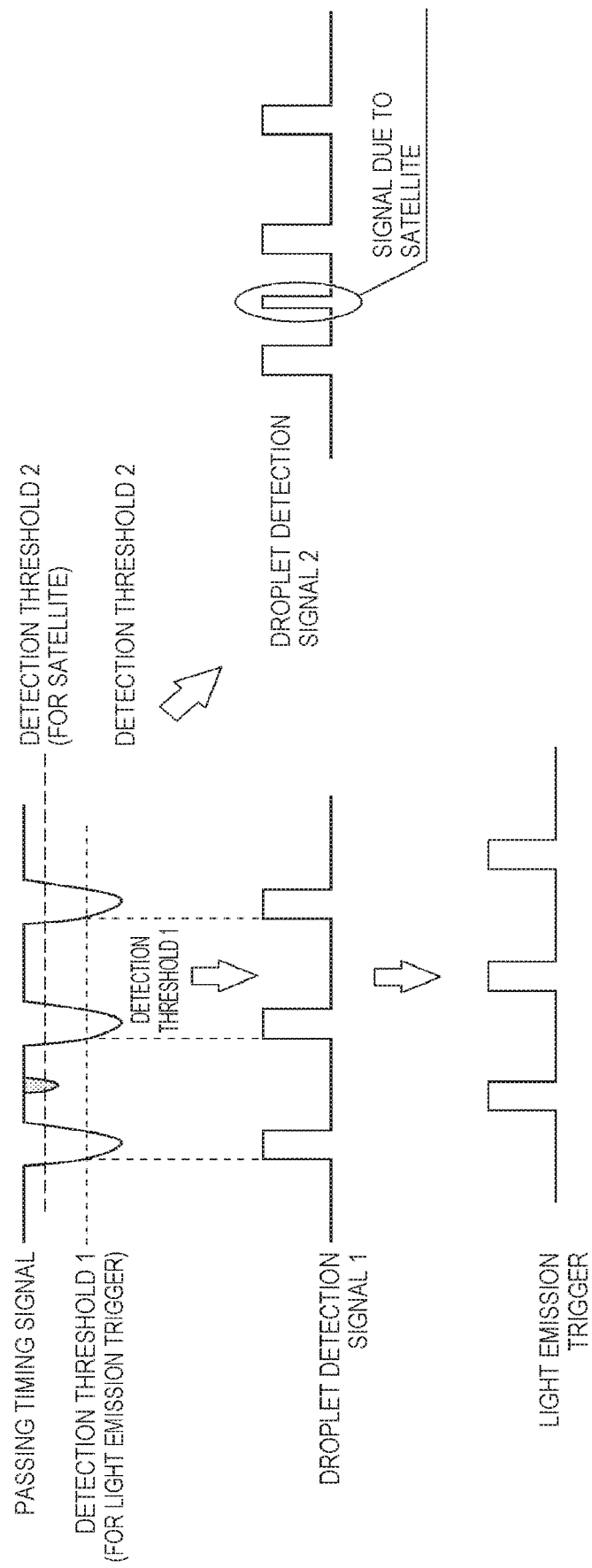
FIG. 14 is an explanatory diagram illustrating an exemplary droplet detection signal generated in the first embodiment.

FIG. 14 is an explanatory diagram illustrating an exemplary droplet detection signal generated in the first embodiment. As the droplet 136 passes through the predetermined position P on the trajectory from the nozzle 80 to the plasma generating region 26, the amount of illumination light incident on the optical sensor 124 of the light receiving unit 120 decreases. The light receiving unit 120 generates a passing timing signal as a voltage signal in accordance with the amount of illumination light incident on the optical sensor 124.

The control unit 70 generates the droplet detection signal 1 based on the passing timing signal received from the droplet detection device 76 and the detection threshold 1. The control unit 70 also generates the droplet detection signal 2 based on the passing timing signal received from the droplet detection device 76 and the detection threshold 2. In other words, the control unit 70 generates the droplet detection signal 1 in a duration in which the passing timing signal is lower than the detection threshold 1. The control unit 70 also generates the droplet detection signal 2 in a duration in which the passing timing signal is lower than the detection threshold 2.

The droplet detection device 76 corresponds to a form of "droplet detection unit". The detection threshold 1 corresponds to a form of "first detection threshold". The detection threshold 2 corresponds to a form of "second detection threshold". The droplet detection signal 1 corresponds to a form of "first droplet detection signal". The droplet detection signal 2 corresponds to a form of "second droplet detection signal". The operation that the control unit 70 generates the droplet detection signal 1 corresponds to a form of "generating a first droplet detection signal". The operation that the control unit 70 generates the droplet detection signal 2 corresponds to a form of "generating a second droplet detection signal".

The droplet detection signal 1 is input from the control unit 70 to the delay circuit 72. The passing timing signal output from the light receiving unit 120 may be directly input to the delay circuit 72 through the control unit 70. In this case, the droplet detection signal 1 may be generated by the delay circuit 72. The operation that the delay circuit 72 generates the light emission trigger based on the droplet detection signal 1 corresponds to a form of "generating a light emission trigger".

The delay circuit 72 generates the light emission trigger behind the droplet detection signal 1 by a delay time. The light emission trigger is input to the laser apparatus 14. The delay time of the delay circuit 72 is set so that the droplet 136 is irradiated with the pulse laser beam 23 when the droplet 136 passes through the predetermined position P and reaches the plasma generating region 26. The plasma generating region 26 includes the focusing position of the laser beam. Thus, the delay time is set so that the droplet is irradiated with the pulse laser beam 23 output from the laser apparatus 14 upon inputting of the light emission trigger when the droplet 136 passes through the predetermined position P and reaches the focusing position of the laser beam.

The control unit 70 calculates the number of generated satellites from the droplet detection signal 2. The number of generated satellites can be calculated from the number of droplet detection signals 2, the droplet generation frequency, and the measurement duration in accordance with Expression [1].

the number of generated satellites=(the number of droplet detection signals 2)−(the droplet generation frequency [Hz]×the measurement duration [sec])      Expression [1]

The number of droplet detection signals 2 is the number of detection pulses in the droplet detection signal 2. The droplet generation frequency is calculated from the drive frequency of the piezoelectric element.

The control unit 70 also calculates a satellite generation rate from the droplet detection signal 2. The satellite generation rate can be expressed in the ratio of the number of generated satellites relative to the number of normal droplets generated in a certain measurement duration. The satellite generation rate is calculated in accordance with Expression [2] below.

the satellite generation rate=the number of generated satellites/(the number of generated droplets per unit time [/sec]×the measurement duration [sec])      Expression [2]

The measurement duration may have an appropriate value in the range of 10 msec to 10 sec. The measurement duration is, for example, 100 msec. In the present example, the satellite generation rate [%] is obtained by expressing the satellite generation rate defined by Expression [2] in percentage.

The number of generated satellites is calculated in accordance with Expression [1].

The number of generated droplets per unit time is calculated in accordance with Expression [3] below.

the number of generated droplets per unit time [/sec]=1/the droplet generation frequency [Hz]      Expression [3]

The control unit 70 calculates the satellite generation rate [%] in accordance with Expressions [1] to [3]. The number of generated satellites and the satellite generation rate are each an exemplary evaluation parameter for satellites. The processing that the control unit 70 calculates the satellite generation rate [%] corresponds to a form of "calculating an evaluation parameter".

When a certain number of satellites or more are measured in a certain measurement duration or when the satellite generation rate exceeds a predetermined reference value, the control unit 70 determines that the state of droplet connection has degraded, and performs piezoelectric duty adjustment. The piezoelectric duty adjustment is processing of adjusting, to an appropriate value, the duty of a square wave electric signal that drives the piezoelectric element 88. The piezoelectric duty adjustment according to the present embodiment includes the two kinds of adjustment methods of piezoelectric duty vicinity adjustment and piezoelectric duty entire adjustment.

In the piezoelectric duty vicinity adjustment, the duty of a square wave electric signal that drives the piezoelectric element is adjusted to an appropriate value in the vicinity range of a current set value. The piezoelectric duty vicinity adjustment is executed while laser beam irradiation of the droplet 136 is continued.

When the state of droplet connection is not recovered by performing the piezoelectric duty vicinity adjustment, the control unit 70 temporarily stops laser beam irradiation and performs the piezoelectric duty entire adjustment. In the piezoelectric duty entire adjustment, the adjustment range of the duty of an electric signal used for drive of the piezoelectric element 88 is expanded to substantially the entire duty range that can be set, and an optimum duty value is searched in this wide adjustment range.

When the state of droplet connection is not improved by performing the piezoelectric duty entire adjustment, any of measures 1 to 3 described below may be performed.

Measure 1: decrease the pressure in the tank 82 of the target supply unit 18. The speed of a droplet is decreased through the pressure decrease.

Measure 2: replace the piezoelectric element. For example, when the target supply unit 18 includes a plurality of piezoelectric elements, piezoelectric element channels used to vibrate the nozzle 80 are switched.

Measure 3: replace the target supply unit 18. Since device operation needs to be stopped to replace the target supply unit 18, it is desirable to preferentially perform Measure 1 or 2. The priorities of Measures 1 to 3 are high in the stated order.

8.3 Exemplary Piezoelectric Duty Adjustment Processing

Figure 15:
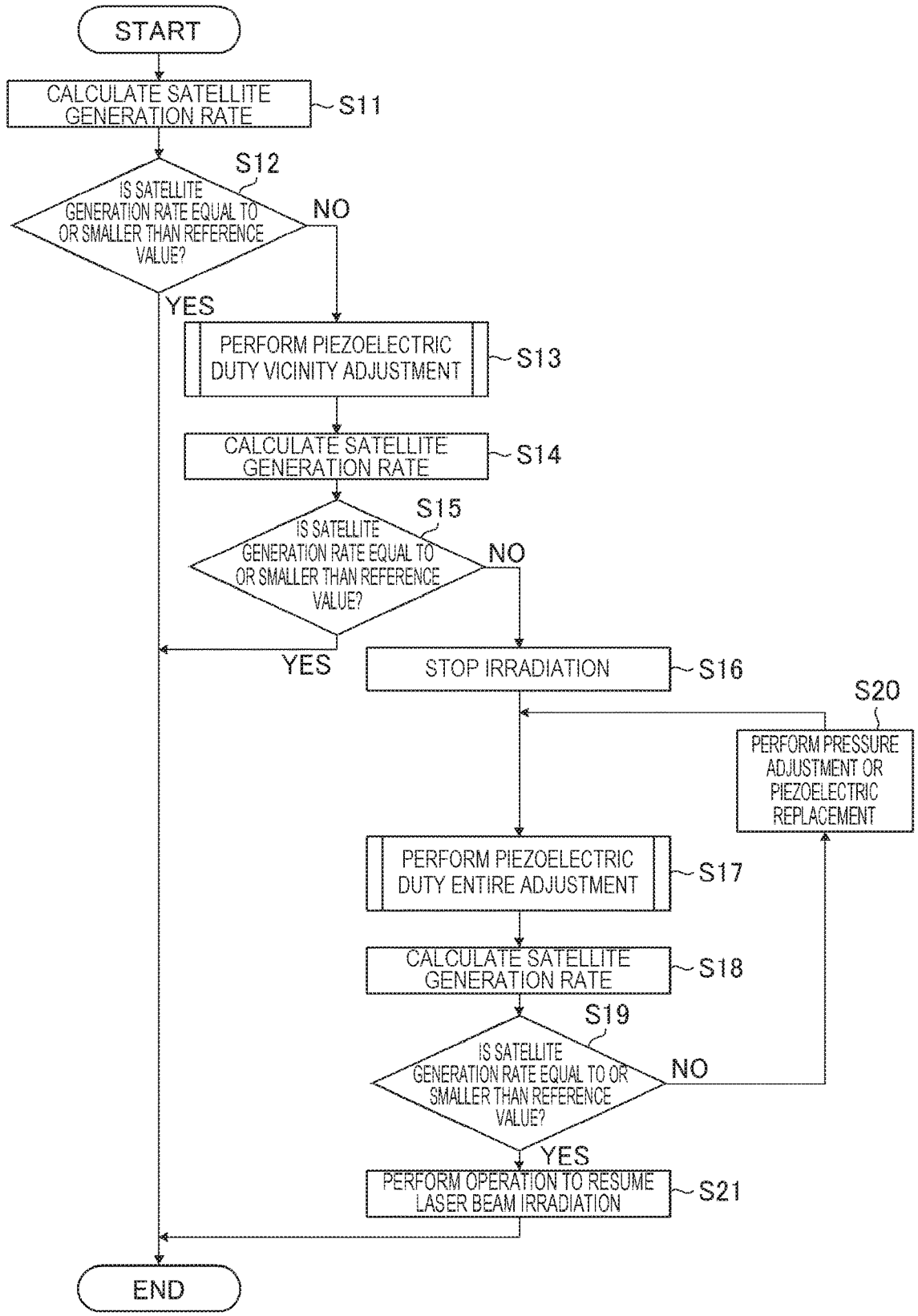
FIG. 15 is a flowchart illustrating exemplary piezoelectric duty adjustment processing performed by an EUV light generation device of the first embodiment.

FIG. 15 is a flowchart illustrating exemplary piezoelectric duty adjustment processing performed by the EUV light generation device according to Embodiment 1.

At step S11, the control unit 70 calculates the satellite generation rate. The satellite generation rate is calculated in accordance with Expression [2]. When the satellite generation rate is calculated, the number of generated satellites is calculated in accordance with Expression [1].

At step S12, the control unit 70 determines whether the satellite generation rate is equal to or smaller than the reference value. The reference value is set to be, for example, 0.1%. When the satellite generation rate is equal to or smaller than the reference value, piezoelectric duty adjustment is unnecessary. When having determined that the satellite generation rate is equal to or smaller than the reference value at the determination processing at step S12, the control unit 70 ends the piezoelectric duty adjustment processing.

When having determined that the satellite generation rate is larger than the reference value at the determination processing at step S12, the control unit 70 proceeds to step S13.

At step S13, the control unit 70 performs the piezoelectric duty vicinity adjustment. A specific example of the piezoelectric duty vicinity adjustment processing will be described later with reference to FIG. 16. After the piezoelectric duty vicinity adjustment (step S13), the control unit 70 calculates the satellite generation rate at step S14.

At step S15, the control unit 70 determines whether the result of the calculation at step S14 is equal to or smaller than the reference value. When having determined that the satellite generation rate is equal to or smaller than the reference value at the determination processing at step S15, the control unit 70 ends the piezoelectric duty adjustment processing.

When having determined that the satellite generation rate is larger than the reference value at the determination processing at step S15, the control unit 70 proceeds to step S16.

At step S16, the control unit 70 performs processing of stopping laser beam irradiation.

At step S17, the control unit 70 performs the piezoelectric duty entire adjustment. A specific example of the piezoelectric duty entire adjustment processing will be described later with reference to FIG. 17. After the piezoelectric duty entire adjustment (step S17), the control unit 70 calculates the satellite generation rate at step S18.

At step S19, the control unit 70 determines whether the result of the calculation at step S18 is equal to or smaller than the reference value. When having determined that the satellite generation rate is larger than the reference value at the determination processing at step S19, the control unit 70 proceeds to step S20.

At step S20, the control unit 70 performs target supply device pressure adjustment to change the pressure in the tank. Alternatively, when a plurality of piezoelectric elements are disposed in the tank 82, the control unit 70 performs piezoelectric replacement processing of changing piezoelectric elements used to vibrate the nozzle 80. In the piezoelectric replacement processing, channels of piezoelectric elements to be vibrated may be switched from among drive channels of a plurality of piezoelectric elements.

After the processing at step S20, the control unit 70 returns to step S17 to perform the piezoelectric duty entire adjustment.

At step S19, when having determined that the satellite generation rate is equal to or smaller than the reference value, the control unit 70 proceeds to step S21.

At step S21, the control unit 70 performs an operation to resume laser beam irradiation and ends the duty adjustment processing.

Whether or not the loop through the processing at steps S17 to S20 is repeated once or a plurality of times, the control unit 70 may determine that recovery through the adjustment processing is difficult, leave the loop, and end the flowchart in FIG. 15 when negative determination is obtained through the determination processing at step S19. In this case, the control unit 70 performs processing of outputting a warning that prompts work to replace the target supply unit 18.

8.4 Overview of Piezoelectric Duty Vicinity Adjustment

In the piezoelectric duty vicinity adjustment, the control unit 70 changes the duty from the current duty set value by a small amount, measures the satellite generation rate, and searches for a level at which the satellite generation rate is equal to or smaller than the reference value. The current duty set value is referred to as a "current duty value". The range in which the duty is changed in the piezoelectric duty vicinity adjustment, in other words, a duty change range is, for example, the range of the current duty value ±0.1[%]. In the piezoelectric duty vicinity adjustment, a unit change amount as the change amount of the duty per change is, for example, 0.01[%].

The control unit 70 continues the duty change in a range in which the satellite generation rate is allowed. An allowable value that defines the allowable range of the satellite generation rate is set to be larger than the reference value. The allowable value of the satellite generation rate is set to be, for example, an appropriate value in the range of 0.5% to 1.0%. The allowable value of the satellite generation rate is determined based on the relation between the satellite generation rate and EUV performance so that droplet laser beam irradiation can be continued and required EUV output can be obtained.

Specifically, for example, when the current duty value is 50%, the control unit 70 changes the duty value to 49.99%, 49.98%, 49.97%, . . . toward the negative side, and then to 50.01%, 50.02%, 50.03%, . . . toward the positive side. The control unit 70 stores the satellite generation rate calculated at each duty value in association with the duty.

The control unit 70 sets a duty value with which the satellite generation rate is lowest among searched duty values.

When the satellite generation rate exceeds the allowable value during data acquisition of the satellite generation rate through the duty change on the negative side, the control unit 70 stops the data acquisition on the negative side. Then, the control unit 70 temporarily returns to the current duty value as the original duty value, and proceeds to the process of performing the duty change on the positive side. The "original duty value" is a duty value before the adjustment.

When the satellite generation rate exceeds the allowable value during data acquisition of the satellite generation rate through the duty change on the positive side, the control unit 70 stops the data acquisition on the positive side, and sets a duty value with which the satellite generation rate is lowest among duty values searched so far.

When a duty with which the satellite generation rate is equal to or smaller than the reference value is not found through the search, the control unit 70 ends the piezoelectric duty vicinity adjustment, and performs the piezoelectric duty entire adjustment.

Figure 16:
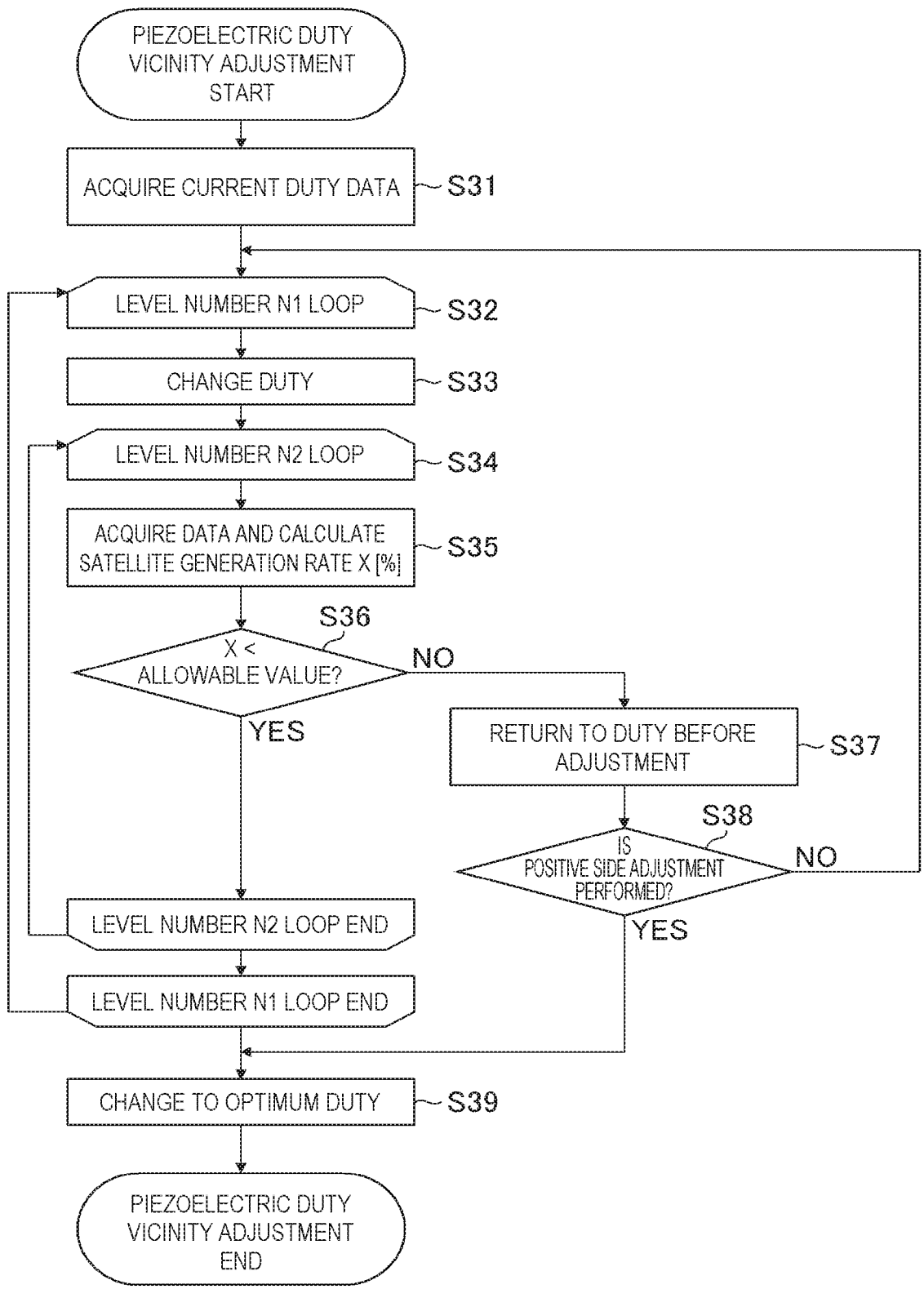
FIG. 16 is a flowchart illustrating exemplary piezoelectric duty vicinity adjustment processing.

FIG. 16 is a flowchart illustrating exemplary piezoelectric duty vicinity adjustment processing. When the piezoelectric duty vicinity adjustment processing is started, the control unit 70 acquires data of the current duty at step S31.

At step S32, the control unit 70 performs first loop processing with a level number N1. The level number N1 is the quotient of division of the duty change range by the unit change amount. In the present example, the change rate is 0.2%, and the unit change amount is 0.01%. The first loop processing calculates the satellite generation rate for each duty value obtained by changing the duty by the unit change amount.

At step S33, the control unit 70 changes the duty by the unit change amount. The piezoelectric duty vicinity adjustment includes negative side adjustment of changing the duty toward the negative side and calculating the satellite generation rate, and positive side adjustment of changing the duty toward the positive side and calculating the satellite generation rate. In the present example, the negative side adjustment is performed first.

Specifically, for example, when the current duty is 50%, the change is made to 49.99%, 49.98%, . . . , and 49.90%, and thereafter to 50.01%, 50.02%, . . . , and 50.10%. The value 49.90% is the lower limit of the change rate on the negative side, in other words, the lower limit of −0.1%. The value 50.1% is the upper limit of the change rate on the positive side, in other words, the upper limit of +0.1%.

After the duty change at step S33, the control unit 70 performs second loop processing with a level number N2 at step S34. The level number N2 is the number of data samples at data acquisition of the satellite generation rate. The level number N2 may be set to be an appropriate value. The level number N2 is set to be, for example, 10.

At step S35, the control unit 70 acquires data of the droplet detection signal 2, and calculates the satellite generation rate. The value of the satellite generation rate calculated at step S35 is denoted by X [%]. The control unit 70 stores data of the calculated satellite generation rate in association with the duty level. Step S35 corresponds to a form of "processing of storing the evaluation parameter in association with the duty value" and "step of storing the evaluation parameter in association with the duty value".

At step S36, the control unit 70 determines whether the value of the satellite generation rate calculated at step S35 is equal to or smaller than the allowable value. When X is smaller than the allowable value at the determination processing at step S36, the control unit 70 repeats the second loop processing. When X is equal to or larger than the allowable value at the determination processing at step S36, the control unit 70 stops the second loop processing and proceeds to step S37. The determination processing at step S36 may be performed by comparing the average value of results of measurement of the satellite generation rate for N2 times with the allowable value. Step S36 corresponds to a form of "processing of determining whether the evaluation parameter is in a predetermined allowable range" and "step of determining whether the evaluation parameter is in a predetermined allowable range". The allowable value defines the predetermined allowable range.

At step S37, the control unit 70 performs processing of returning to the duty before the adjustment. The duty before the adjustment is the current duty acquired at step S31.

At step S38, the control unit 70 determines whether the positive side adjustment is performed. When having determined that the positive side adjustment is yet to be performed at the determination processing at step S38, the control unit 70 returns to the first loop processing at step S32 to perform the positive side adjustment. In other words, when the satellite generation rate exceeds the allowable value in the negative side adjustment, the control unit 70 proceeds to the positive side adjustment.

When having performed the positive side adjustment and determined that the positive side adjustment has been performed at the determination processing at step S38, the control unit 70 proceeds to step S39. In other words, when the satellite generation rate exceeds the allowable value through the positive side adjustment, the control unit 70 leaves the first loop processing.

At step S39, the control unit 70 performs processing of changing to an optimum duty based on results of the negative side adjustment and the positive side adjustment. For example, the control unit 70 determines an optimum duty value to be a duty value with which the satellite generation rate decreases most in the range of the change rate. After step S39, the control unit 70 returns to the main flow in FIG. 15.

The "optimum duty value" determined by the control unit 70 at step S39 corresponds to a form of "operation duty value that is a duty value of the electric signal suitable for operation of the vibration element". The processing at step S39 corresponds to a form of "processing of determining the operation duty value" and "step of determining the operation duty value". The piezoelectric duty vicinity adjustment corresponds to a form of "first duty adjustment processing". The vicinity adjustment range defined as the range of the current duty value ±0.1% corresponds to a form of "first adjustment range".

8.5 Overview of Piezoelectric Duty Entire Adjustment

In the piezoelectric duty entire adjustment, the duty value is changed by each step of a predetermined unit change amount through substantially the entire variable range of the duty to acquire data of the droplet interval for each duty value, and an optimum operation duty value is calculated from a measurement result of the droplet interval. For example, in the piezoelectric duty entire adjustment, the duty value is changed by each step of 0.2% from the duty 1% to 99%, and an optimum operation duty value is selected based on a measurement result of the droplet interval for each duty value.

Figure 17:
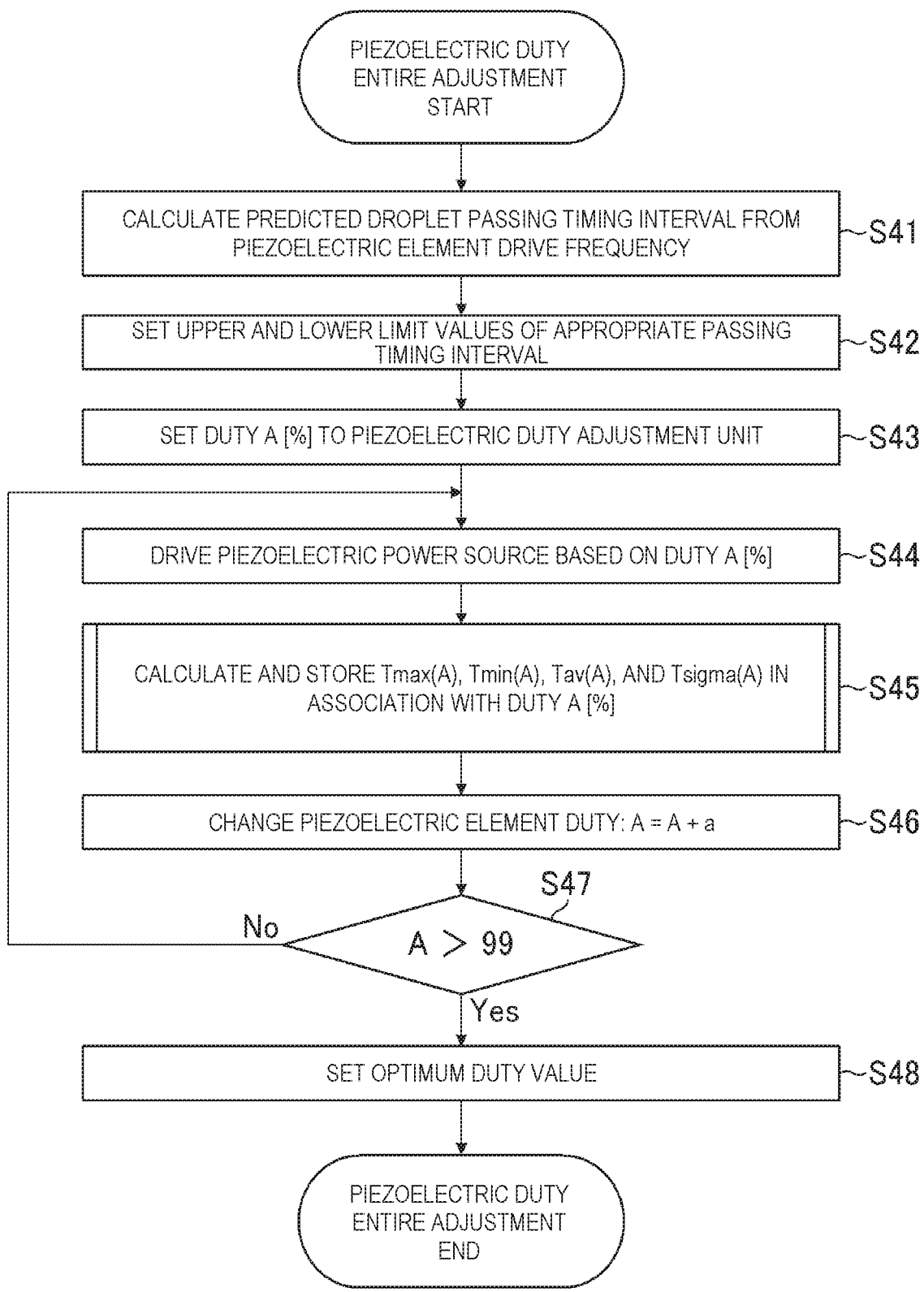
FIG. 17 is a flowchart illustrating exemplary piezoelectric duty entire adjustment processing.

FIG. 17 is a flowchart illustrating exemplary piezoelectric duty entire adjustment processing. When the piezoelectric duty entire adjustment processing illustrated in FIG. 17 is started, the control unit 70 calculates a predicted passing timing interval of droplets from the drive frequency of the piezoelectric element 88 at step S41. The "predicted passing timing interval" is the time interval between droplet passing timings predicted through calculation from the drive frequency of the piezoelectric element. The predicted passing timing interval corresponds to a form of "prediction passing time interval". The predicted passing timing interval serves as a guide for an appropriate passing time interval of droplets.

At step S42, the control unit 70 may set upper and lower limit values of the appropriate passing timing interval of droplets. For example, the control unit 70 may set the upper and lower limit values to be values of the predicted passing timing interval calculated at step S41±15%. Thus, the control unit 70 may set the range of the predicted passing timing interval ±15% to be an appropriate range of the droplet passing timing interval. The processing at step S42 corresponds to a form of "processing of setting an appropriate range of the passing time interval". The appropriate range of the droplet passing timing interval can be a range allowed as the appropriate passing time interval of droplets.

At step S43, the control unit 70 sets the duty value of the piezoelectric duty adjustment unit 154 to be A [%]. The value "A" is a variable parameter indicating the duty value. For example, the control unit 70 may set A=1[%] as an initial value.

At step S44, the piezoelectric duty adjustment unit 154 can drive the piezoelectric power source 96 based on the set duty A [%]. When the piezoelectric power source 96 is driven based on the set duty A [%], a droplet is generated, and a passing timing signal is output from the droplet detection device 76.

When having received the passing timing signal, the control unit 70 measures each passing timing interval T(1), T(2), . . . , T(N) between droplets. The value N is an optional natural number that indicates the number of times that the passing timing interval is measured, and can be determined in advance. For example, N may be between 3 to 50 inclusive. As an example, N may be 10. The natural number k may be used to define the passing timing interval T(k) by the time interval "t(k+1)–t(k)" between the passing timing t(k) of the k-th droplet and the passing timing t(k+1) of the (k+1)-th droplet. Each passing timing interval T(1), T(2), . . . , T(N) measured by the control unit 70 corresponds to a form of "measured passing time interval".

At step S45, the control unit 70 stores the measured passing timing intervals T(1), T(2), . . . , T(N). In addition, the control unit 70 calculates, from each passing timing interval T(1), T(2), . . . , T(N), a maximum passing timing interval Tmax, a minimum passing timing interval Tmin, a passing timing interval average value Tav, and a passing timing interval variance Tsigma. The variance Tsigma may be the 3σ value of standard deviation. The 3σ value of standard deviation is the value of "3×σ" where σ represents the standard deviation.

At step S45, the control unit 70 stores the calculated Tmax, Tmin, Tav, and Tsigma as Tmax(A), Tmin(A), Tav(A), and Tsigma(A) in association with the duty A [%]. Processing at step S45 will be described later with reference to FIG. 18.

For example, the control unit 70 sequentially changes the set duty A from A=1 to 99[%] by each step of a unit change amount a=0.2[%], and performs the processing at steps S44 and S45 for each duty value.

Specifically, at step S46, the control unit 70 changes the duty A of the piezoelectric power source 96 that drives the piezoelectric element 88 to "A+a". Through step S46, the value of "A+a" is newly set as the duty A. After step S46, the control unit 70 proceeds to step S47.

At step S47, the control unit 70 may determine whether the duty A exceeds 99[%]. When having determined that the duty A is equal to or smaller than 99[%] at step S47, the control unit 70 returns to step S44. The processing at steps S44 to S47 is repeated until the duty A exceeds 99[%].

When having determined that the duty A exceeds 99[%] at step S47, the control unit 70 proceeds to step S48.

At step S48, the control unit 70 may determine an optimum value of the duty based on the data stored in association with each duty A [%], and set the determined optimum value to the piezoelectric duty adjustment unit 154 as an optimum duty value.

The control unit 70 extracts, from the stored data, a group of data having Tmax(A), Tmin(A), and Tav(A) in the appropriate range of the droplet passing timing interval, and determines the optimum value to be the duty A having the minimum Tsigma(A) in the extracted group of data. The appropriate range of the droplet passing timing interval may be a range defined by the upper and lower limit values determined at step S42.

After the optimum duty value is set at step S48, the control unit 70 ends the piezoelectric duty entire adjustment processing in FIG. 17, and returns to the flowchart in FIG. 15.

Thereafter, the piezoelectric duty adjustment unit 154 can drive the piezoelectric power source 96 based on the set duty.

As described above, the control unit 70 changes the duty value at step S46, and performs the processing at step S45 for each of a plurality of duty values. This configuration corresponds to a form of "processing of storing the measured passing time interval between droplets generated at each duty value and the variance of the measured passing time interval in association with the duty value". Each of Tmax(A) and Tmin(A) stored in the control unit 70 at step S45 corresponds to a form of "measured passing time interval" stored in association with the duty value.

The "optimum duty value" determined by the control unit 70 at step S48 corresponds to a form of "operation duty value that is a duty value of the electric signal suitable for operation of the vibration element". The processing at step S48 corresponds to a form of "processing of determining the operation duty value" and "step of determining the operation duty value". The piezoelectric duty entire adjustment corresponds to a form of "second duty adjustment processing". The entire adjustment range defined as the range of the duty 1% to 99% corresponds to a form of "second adjustment range".

Figure 18:
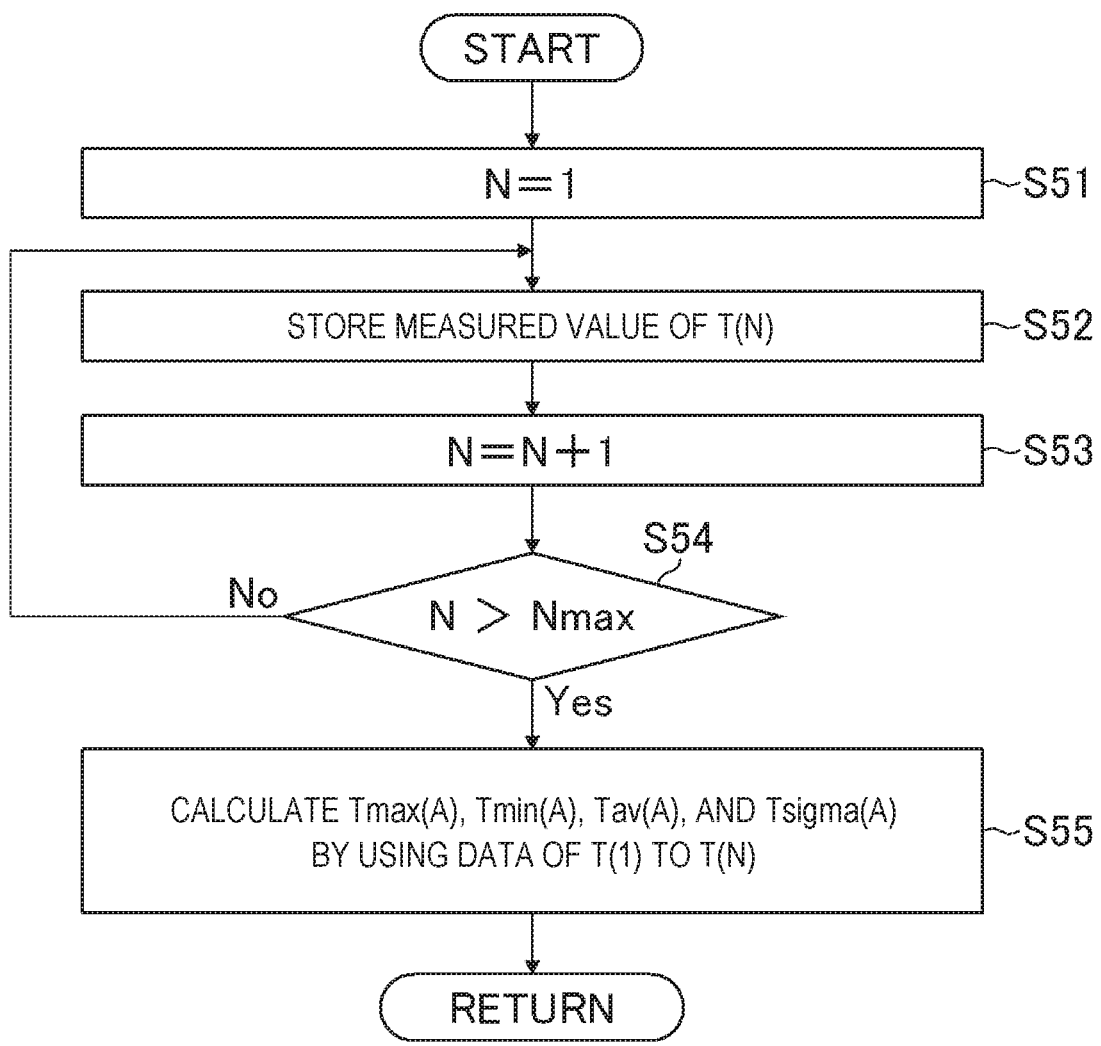
FIG. 18 is a flowchart illustrating exemplary processing at step S45 in FIG. 17.

FIG. 18 is a flowchart illustrating exemplary processing at step S45 in FIG. 17. At step S51 in FIG. 18, the control unit 70 may set the parameter N to be the initial value of N=1.

At step S52, the control unit 70 stores a measured value of the passing timing interval T(N).

At step S53, the control unit 70 increments the value of N by "+1", and newly sets the value of "N+1" as the value of the parameter N.

At step S54, the control unit 70 determines whether the value of N exceeds a defined value Nmax determined in advance. The value Nmax may be set to be an optional integer larger than the maximum number of times of measurement of the passing timing interval. For example, Nmax may be set to be an appropriate value in the range of 4 to 51.

When having determined that N≤Nmax holds at step S54, the control unit 70 returns to step S52.

When having determined that N>Nmax holds at step S54, the control unit 70 proceeds to step S55.

At step S55, the control unit 70 calculates Tmax(A), Tmin(A), Tav(A), and Tsigma(A) by using the data of T(1) to T(N). The control unit 70 stores the calculated Tmax(A), Tmin(A), Tav(A), and Tsigma(A).

After step S55, the control unit 70 returns to the flowchart in FIG. 17.

8.6 Piezoelectric Duty

Figure 19:
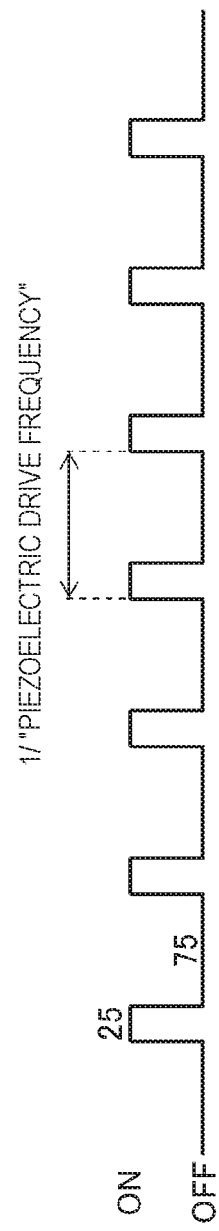
FIG. 19 is a waveform diagram exemplarily illustrating a square wave signal having a duty of 25%.
Figure 20:
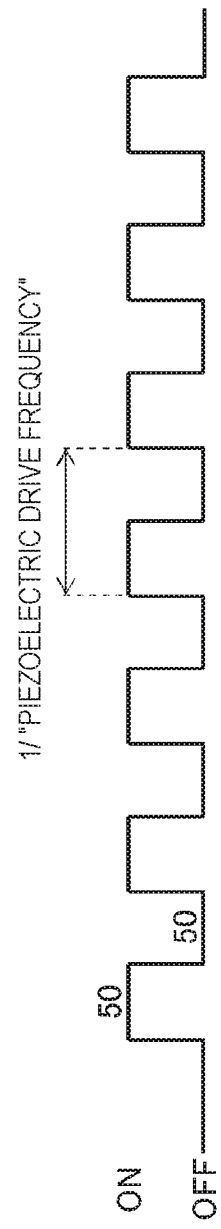
FIG. 20 is a waveform diagram exemplarily illustrating a square wave signal having a duty of 50%.

FIGS. 19 and 20 illustrate exemplary changes of the duty of an electric signal for driving the piezoelectric element. FIG. 19 illustrates an exemplary square wave supplied from the piezoelectric duty adjustment unit 154 to the piezoelectric power source 96 and having a duty of 25%. FIG. 20 illustrates an exemplary square wave supplied from the piezoelectric duty adjustment unit 154 to the piezoelectric power source 96 and having a duty of 50%.

The duty is determined by the ratio of the duration in which the square wave is kept on relative to a period t calculated by an equation below.

$$t = 1/\text{"piezoelectric drive frequency"}$$

In the piezoelectric duty vicinity adjustment, the control unit 70 changes the duty by changing the duration in which the square wave supplied from the piezoelectric duty adjustment unit 154 to the piezoelectric power source 96 is kept on, and calculates the satellite generation rate for each duty value. For example, the control unit 70 changes the duty value by each step of 0.01% in the vicinity adjustment range of the current duty value ±0.1%, and calculates the satellite generation rate for each duty value. Then, the control unit 70 determines an optimum operation duty value in the vicinity adjustment range to be a duty value having the smallest satellite generation rate among the duty values for which the satellite generation rate is calculated.

In the piezoelectric duty entire adjustment, the control unit 70 changes the duty by changing the duration in which the square wave supplied from the piezoelectric duty adjustment unit 154 to the piezoelectric power source 96 is kept on, and measures the droplet passing timing interval for each duty value. The control unit 70 may calculate the variance Tsigma of the passing timing interval for each duty value. For example, the control unit 70 performs the calculation for each duty value in the entire adjustment range of the duty 1% to 99%. Then, the control unit 70 determines an optimum operation duty value in the entire adjustment range to be a duty value having a measured passing timing interval in an appropriate range determined by the upper and lower limit values and having the smallest Tsigma.

The operation of the target supply device according to the first embodiment corresponds to a form of "target supply method".

8.7 Effect

According to the first embodiment, since the two separate detection thresholds 1 and 2 are used for droplet detection, it is possible to perform satellite detection without affecting the light emission trigger at satellite generation.

According to the first embodiment, when the number of satellites has increased, the piezoelectric duty adjustment can be performed to reduce satellite generation.

According to the first embodiment, when a satellite is generated, it is possible to perform laser beam irradiation of the main DL other than the satellite without wrongly irradiating the satellite with a laser beam. Thus, it is possible to perform the piezoelectric duty adjustment while continuing laser beam irradiation of droplets. According to the first embodiment, it is possible to reduce generation of droplet satellites, thereby reducing decrease of EUV optical energy and damage on the laser apparatus.

9. Embodiment 2

9.1 Configuration

Figure 21:
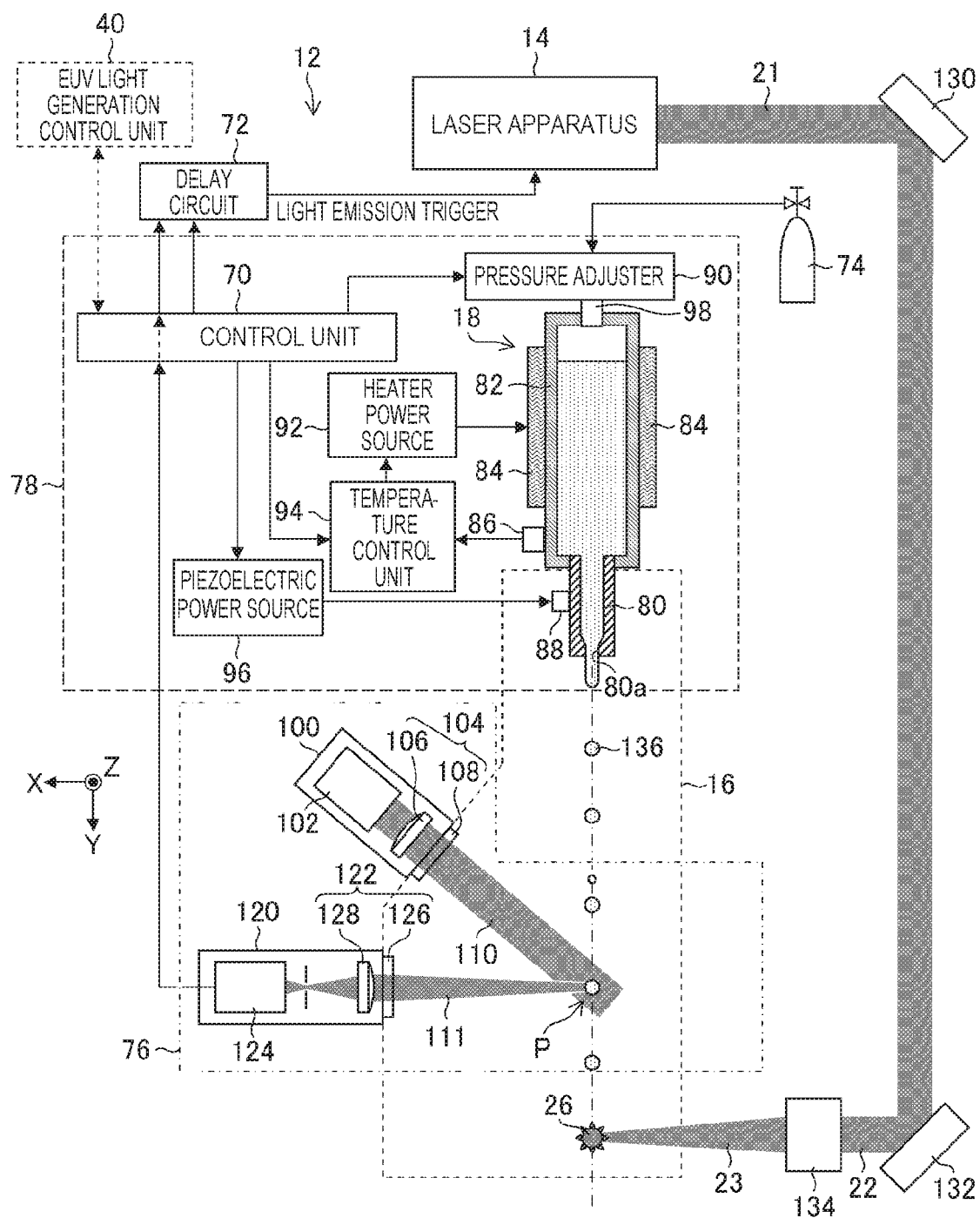
FIG. 21 is a diagram schematically illustrating the configuration of the EUV light generation device according to a second embodiment.

FIG. 21 schematically illustrates the configuration of an EUV light generation device according to a second embodiment. Differences of the second embodiment illustrated in FIG. 21 from the first embodiment will be described below. In the EUV light generation device 12 according to the second embodiment, the disposition relation between the light source unit 100 and the light receiving unit 120 of the droplet detection device 76 is different from that in the first embodiment. The light receiving unit 120 of the droplet detection device 76 in the second embodiment is disposed to receive reflected light 111 from a droplet irradiated with the illumination light 110 output from the light source unit 100.

The light receiving optical system 122 of the light receiving unit 120 includes the window 126 and the condenser lens 128. The light receiving optical system 122 may be a light focusing optical system.

9.2 Operation

FIG. 22 is an explanatory diagram illustrating an exemplary droplet detection signal generated in the second embodiment. As the droplet 136 passes through the predetermined position P on the trajectory from the nozzle 80 to the plasma generating region 26, the amount of reflected light incident on the optical sensor 124 of the light receiving unit 120 increases. The light receiving unit 120 generates a passing timing signal as a voltage signal in accordance with the amount of reflected light incident on the optical sensor 124.

The passing timing signal has a voltage value higher than the base line as a droplet passes through the predetermined position P. Thus, in the second embodiment, in setting of the detection thresholds 1 and 2, each detection threshold is set to be 0 to 100% with the lower limit of 0% taken to be an average voltage value at the base line and the upper limit of 100% taken to be an average voltage value at droplet passing. The satellite detection threshold 2 is set to be lower than the light emission trigger detection threshold 1. In other words, the detection threshold 2 is set to be a value closer to the lower limit than the detection threshold 1 and having a smaller absolute value from the base line than the detection threshold 1.

In the second embodiment, the magnitude relation between each of the detection thresholds 1 and 2 and the voltage value of the passing timing signal is inverted with respect to that in the first embodiment. Accordingly, input signals to the Vin+ and Vin− terminals of each of the first comparator 161 and the second comparator 162 described with reference to FIG. 13 may be interchanged. Alternatively, in the second embodiment, the droplet detection signals 1 and 2 may have an inverted relation between the "High" and "Low" levels of the droplet detection signals 1 and 2 with respect to that described in the first embodiment.

The operation of obtaining the droplet detection signals 1 and 2 and the subsequent signal processing are same as those in the first embodiment.

9.3 Effect

The effect of the second embodiment is same as that of the first embodiment.

10. Modifications of Embodiments

10.1 Modification 1

The number of satellites generated in a constant time may be evaluated instead of evaluating the satellite generation rate. Specifically, a reference value for the number of generated satellites may be determined and compared with the number of generated satellites calculated from the droplet detection signal 2.

10.2 Modification 2

The adjustment range of the piezoelectric duty entire adjustment does not need to be the entire variable range of the duty nor substantially the entire variable range thereof, but may be part of the variable range. The adjustment range of the piezoelectric duty entire adjustment only needs to be wider than the adjustment range of the piezoelectric duty vicinity adjustment.

11. Laser Apparatus

The laser apparatus 14 may include a pre-pulse laser apparatus configured to output a pre-pulse laser beam, and a main pulse laser apparatus configured to output a main pulse laser beam. In the LPP EUV light generation device 12 in the present embodiment, a target in the form of droplet is diffused through irradiation with a pre-pulse laser beam to form a diffused target, and then the diffused target is irradiated with a main pulse laser beam. When the diffused target is irradiated with the main pulse laser beam in this manner, plasma can be efficiently generated from the target substance. This configuration can improve conversion efficiency (CE) from the energy of the pulse laser beam to the energy of EUV light.

The pre-pulse laser beam for forming a diffused target includes short pulses each having a pulse width shorter than one nanosecond [ns], preferably shorter than 500 picoseconds [ps], more preferably shorter than 50 picoseconds [ps]. In addition, the fluence of each pulse of the pre-pulse laser beam is equal to or smaller than the fluence of each pulse of the main pulse laser beam, and is equal to or larger than 6.5 $J/cm^2$, preferably equal to or larger than 30 $J/cm^2$, more preferably equal to or larger than 45 $J/cm^2$.

With such a configuration, the target can be diffused through breakdown into minute particles by shortening the pulse width of each pulse of the pre-pulse laser beam. Accordingly, when a diffused target is irradiated with the main pulse laser beam, plasma is efficiently generated from the target, which leads to improvement of the CE.

Alternatively, the target may be irradiated with a plurality of pre-pulse laser beams before irradiation with the main pulse laser beam.

The above description is intended to provide not restriction but examples. Thus, the skilled person in the art would clearly understood that the embodiments of the present disclosure may be changed without departing from the scope of the claims.

The terms used throughout the specification and the appended claims should be interpreted as "non-limiting". For example, the term "comprising" or "comprised" should be interpreted as "not limited to what has been described as being comprised". The term "having" should be interpreted as "not limited to what has been described as having". It should be understood that the indefinite article "a" in the present specification and the claims means "at least one" or "one or more".

What is claimed is:

1. A target supply device comprising:
   a tank housing a target substance that is liquid;
   a nozzle from which the target substance housed in the tank is output;
   a vibration element driven upon receiving of an electric signal that is a square wave, the vibration element being configured to generate a droplet of the target substance by vibrating the target substance to be output from the nozzle;
   a droplet detection unit configured to detect the droplet output from the nozzle; and
   a control unit to which a first detection threshold and a second detection threshold to be compared with a detection signal obtained from the droplet detection unit are set,
   the first detection threshold being used to generate a light emission trigger for a laser beam with which the droplet is to be irradiated,
   the second detection threshold having a smaller absolute value from a base line of the detection signal than the first detection threshold, and
   the control unit being configured to perform
      processing of calculating an evaluation parameter for a satellite of the droplet based on the detection signal and the second detection threshold, and
      processing of determining, based on the evaluation parameter, an operation duty value that is a duty value of the electric signal suitable for operation of the vibration element.

2. The target supply device according to claim 1, wherein the evaluation parameter is at least one of a satellite generation rate and the number of satellites generated in a constant time.

3. The target supply device according to claim 1, wherein the control unit performs the processing of determining the operation duty value based on the evaluation parameter while continuing irradiation of the droplet with the laser beam based on the light emission trigger.

4. The target supply device according to claim 1, wherein the control unit performs the processing of determining the operation duty value when the evaluation parameter is larger than a predetermined reference value.

5. The target supply device according to claim 1, wherein the control unit executes first duty adjustment processing of determining the operation duty value in a first adjustment range in which the duty value is changed, and then performs second duty adjustment processing of determining the operation duty value in a second adjustment range in which the duty value is changed and that is larger than the first adjustment range.

6. The target supply device according to claim 5, wherein the control unit executes the second duty adjustment processing while stopping irradiation of the droplet with the laser beam.

7. The target supply device according to claim 5, wherein the control unit executes the first duty adjustment processing when the evaluation parameter is larger than a predetermined reference value, and
   performs the processing of calculating the evaluation parameter after having executed the first duty adjustment processing, and performs the second duty adjustment processing when the evaluation parameter calculated after execution of the first duty adjustment processing is larger than the reference value.

8. The target supply device according to claim 1, wherein
the control unit generates a first droplet detection signal based on the detection signal obtained from the droplet detection unit and the first detection threshold,
generates a second droplet detection signal based on the detection signal and the second detection threshold, and
calculates the evaluation parameter based on the second droplet detection signal.

9. The target supply device according to claim 8, wherein,
in the processing of calculating the evaluation parameter, the control unit calculates the number of generated satellites expressed by an expression below:

the number of generated satellites=(the number of second droplet detection signals)−(droplet generation frequency [Hz]×measurement duration [sec]).

10. The target supply device according to claim 9, wherein,
in the processing of calculating the evaluation parameter, the control unit calculates a satellite generation rate expressed by an expression below:

satellite generation rate=the number of generated satellites/(the number of generated droplets per unit time [/sec]×measurement duration [sec]), where the number of generated droplets per unit time [/sec]=1/droplet generation frequency [Hz].

11. The target supply device according to claim 8, wherein
the control unit performs first duty adjustment processing including
processing of changing the duty value of the electric signal to be input to the vibration element, inputting the electric signal having each of a plurality of duty values to the vibration element, and storing, in association with the duty value, the evaluation parameter calculated for the satellite of the droplet generated at each duty value,
processing of determining whether the evaluation parameter is in a predetermined allowable range, and
processing of determining the operation duty value from among duty values at which the evaluation parameter in the allowable range is obtained.

12. The target supply device according to claim 11, wherein
the control unit performs the first duty adjustment processing when the evaluation parameter is larger than a predetermined reference value, and
an allowable value that defines the allowable range is set to be larger than the reference value.

13. The target supply device according to claim 8, wherein
the control unit performs second duty adjustment processing including
processing of measuring a passing time interval of the droplet based on the first droplet detection signal, and
processing of determining the operation duty value as the duty value of the electric signal suitable for operation of the vibration element based on the measured passing time interval obtained by the measurement.

14. The target supply device according to claim 13, wherein
the second duty adjustment processing includes
processing of setting an appropriate range of the passing time interval,
processing of changing the duty value of the electric signal to be input to the vibration element, inputting the electric signal having each of a plurality of duty values to the vibration element, and storing, in association with the duty value, the measured passing time interval of the droplet generated at each duty value and variance of the measured passing time interval, and
processing of determining, based on the variance, the operation duty value from among duty values, the measured passing time interval of each of which is in the appropriate range among the stored duty values.

15. The target supply device according to claim 1, wherein
the detection signal obtained from the droplet detection unit is a signal indicating a voltage value lower than the voltage value of the base line when the droplet passes through a predetermined position, and the second detection threshold is set to be a voltage value higher than the first detection threshold.

16. The target supply device according to claim 1, wherein
the detection signal obtained from the droplet detection unit is a signal indicating a voltage value higher than the voltage value of the base line when the droplet passes through a predetermined position, and the second detection threshold is set to be a voltage value lower than the first detection threshold.

17. An extreme ultraviolet light generation device comprising:
a chamber in which plasma is generated; and
a target supply device configured to supply a target as a generation source of the plasma into the chamber,
a droplet as the target being supplied from the target supply device into the chamber and irradiated with a laser beam to generate plasma from which extreme ultraviolet light is generated,
the target supply device including
a tank housing a target substance that is liquid,
a nozzle from which the target substance housed in the tank is output,
a vibration element driven upon receiving of an electric signal that is a square wave, the vibration element being configured to generate a droplet of the target substance by vibrating the target substance to be output from the nozzle,
a droplet detection unit configured to detect the droplet output from the nozzle, and
a control unit to which a first detection threshold and a second detection threshold to be compared with a detection signal obtained from the droplet detection unit are set,
the first detection threshold being used to generate a light emission trigger for a laser beam with which the droplet is to be irradiated, the second detection threshold having a smaller absolute value from a base line of the detection signal than the first detection threshold, and
the control unit being configured to perform
processing of calculating an evaluation parameter for a satellite of the droplet based on the detection signal and the second detection threshold, and processing of determining, based on the evaluation parameter, an operation duty value that is a duty value of the electric signal suitable for operation of the vibration element.

18. A target supply method that uses a target supply device including:
- a tank housing a target substance that is liquid;
- a nozzle from which the target substance housed in the tank is output;
- a vibration element driven upon receiving of an electric signal that is a square wave, the vibration element being configured to generate a droplet of the target substance by vibrating the target substance to be output from the nozzle; and
- a droplet detection unit configured to detect the droplet output from the nozzle, the target supply method comprising the steps of:
- setting a first detection threshold and a second detection threshold to be compared with a detection signal obtained from the droplet detection unit, the second detection threshold having a smaller absolute value from a base line of the detection signal than the first detection threshold;
- generating a light emission trigger for a laser beam with which the droplet is to be irradiated based on the detection signal and the first detection threshold;
- calculating an evaluation parameter for a satellite of the droplet based on the detection signal and the second detection threshold; and
- determining an operation duty value that is a duty value of the electric signal suitable for operation of the vibration element based on the evaluation parameter.

19. The target supply method according to claim 18, further comprising the steps of:
- generating a first droplet detection signal based on the detection signal obtained from the droplet detection unit and the first detection threshold; and
- generating a second droplet detection signal based on the detection signal and the second detection threshold,
- wherein the evaluation parameter is calculated based on the second droplet detection signal.

20. The target supply method according to claim 19, further comprising the steps of:
- changing the duty value of the electric signal to be input to the vibration element, inputting the electric signal having each of a plurality of duty values to the vibration element, and storing, in association with the duty value, the evaluation parameter calculated for the satellite of the droplet generated at each duty value;
- determining whether the evaluation parameter is in a predetermined allowable range; and
- determining the operation duty value from among duty values at which the evaluation parameter in the allowable range is obtained.

* * * * *